(12) United States Patent
Singh

(10) Patent No.: US 10,503,184 B2
(45) Date of Patent: Dec. 10, 2019

(54) DYNAMIC ADJUSTMENT OF OPERATING CONDITIONS OF INTEGRATED CIRCUITS

(71) Applicant: Ambient Scientific Inc., San Jose, CA (US)

(72) Inventor: Gajendra Prasad Singh, San Jose, CA (US)

(73) Assignee: Ambient Scientific, Inc., San Jose, CA (US)

( * ) Notice: Subject to any disclaimer, the term of this patent is extended or adjusted under 35 U.S.C. 154(b) by 0 days.

(21) Appl. No.: 16/250,432

(22) Filed: Jan. 17, 2019

(65) Prior Publication Data

US 2019/0286179 A1    Sep. 19, 2019

Related U.S. Application Data

(60) Provisional application No. 62/644,335, filed on Mar. 16, 2018.

(51) Int. Cl.
*H03B 19/00* (2006.01)
*G05F 1/46* (2006.01)
(Continued)

(52) U.S. Cl.
CPC .......... *G05F 1/462* (2013.01); *G01R 31/2851* (2013.01); *G06F 17/5031* (2013.01)

(58) Field of Classification Search
CPC ..... H03L 7/093; H03L 7/0814; H03L 7/0891; H03L 7/087
See application file for complete search history.

(56) References Cited

U.S. PATENT DOCUMENTS 9,223,327 B1    12/2015   Zhu et al.
2005/0099210 A1*   5/2005   Fetzer ................. G06F 1/3203
                                                  327/101
(Continued)

FOREIGN PATENT DOCUMENTS

WO    2009015326 A1    1/2009

OTHER PUBLICATIONS

International Search Report and Written Opinion dated Jun. 4, 2019 in PCT application No. PCT/US2019/022021 filed Mar. 13, 2019.

*Primary Examiner* — Sibin Chen
(74) *Attorney, Agent, or Firm* — Thomas C. Chan; Silicon Valley Patent Group LLP

(57) ABSTRACT

Apparatuses and Methods for dynamic adjustment of operating conditions of integrated circuits are provided. The method includes receiving, from a voltage reference module, an operating voltage of the integrated circuit, receiving a reference clock to be used as an operating frequency of the integrated circuit and is distributed to by the plurality of circuit blocks in the integrated circuit, measuring feedback path timing information of one or more circuit blocks in the plurality of circuit blocks, comparing the feedback path timing information of the one or more circuit blocks to the reference clock, determining timing margins of corresponding one or more feedback paths of the one or more circuit blocks based on the comparison, and generating a feedback for adjusting the operating voltage or the operating frequency of the integrated circuit based on the timing margins of the one or more feedback paths of the one or more circuit blocks.

18 Claims, 19 Drawing Sheets

(51) Int. Cl.
*G06F 17/50* (2006.01)
*G01R 31/28* (2006.01)

(56) References Cited

U.S. PATENT DOCUMENTS

| | | | |
|---|---|---|---|
| 2006/0192229 A1* | 8/2006 | Kato | .................. H01L 27/13 257/207 |
| 2015/0254384 A1 | 9/2015 | Dumchin et al. | |
| 2017/0102732 A1 | 4/2017 | Campisano et al. | |
| 2017/0177064 A1 | 6/2017 | Christensen et al. | |

* cited by examiner

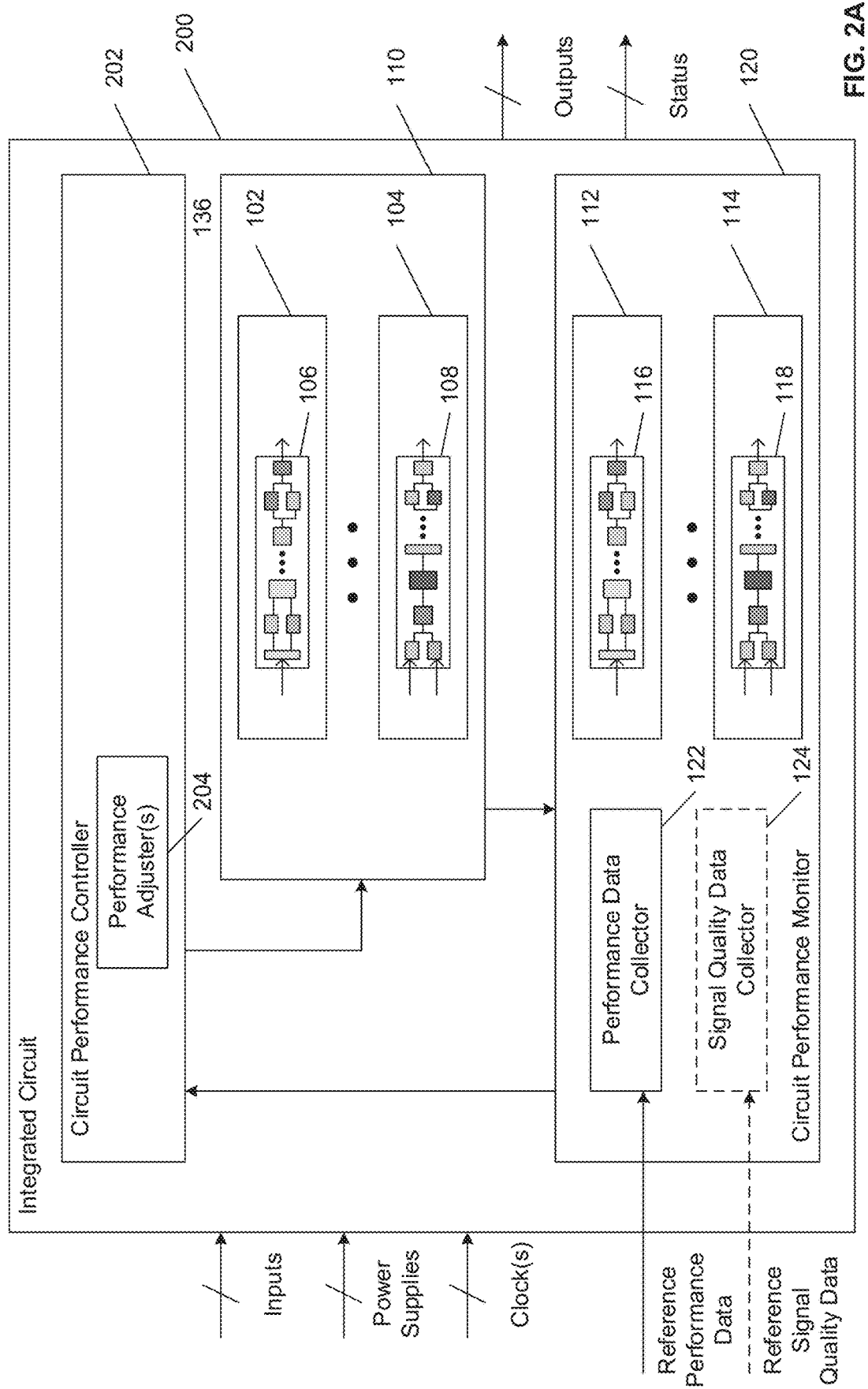

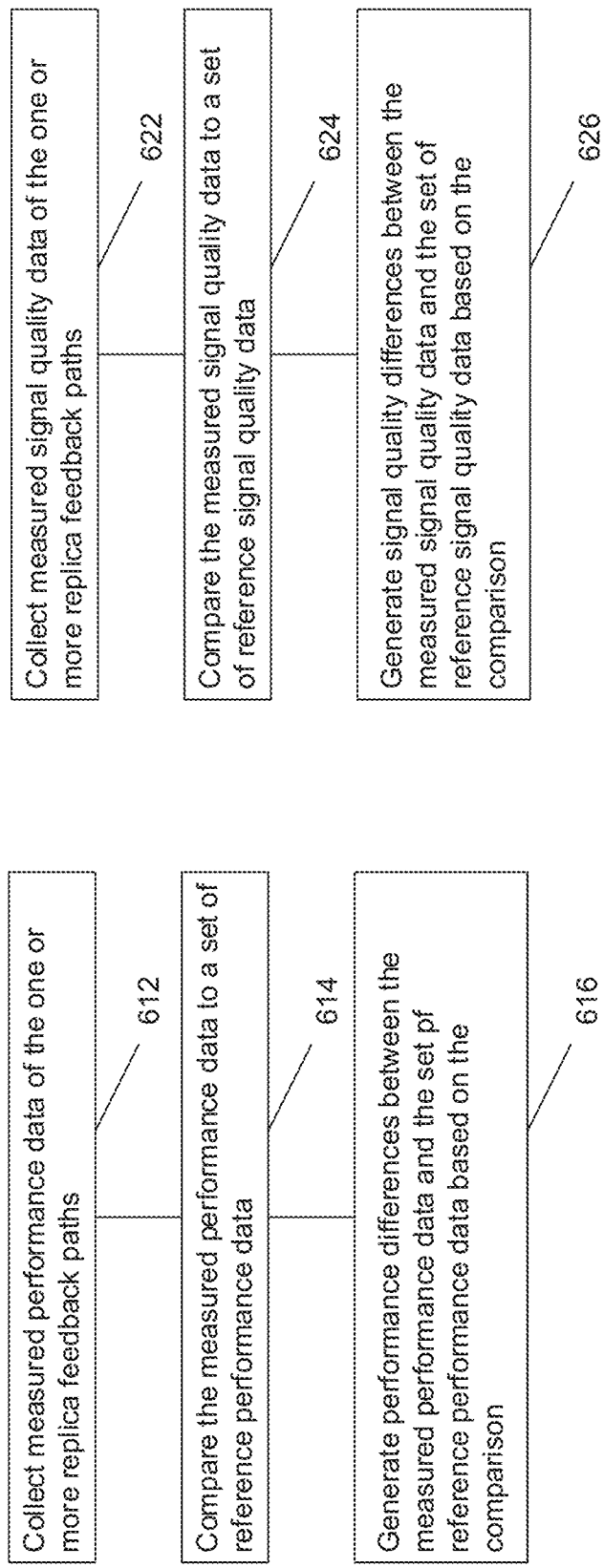

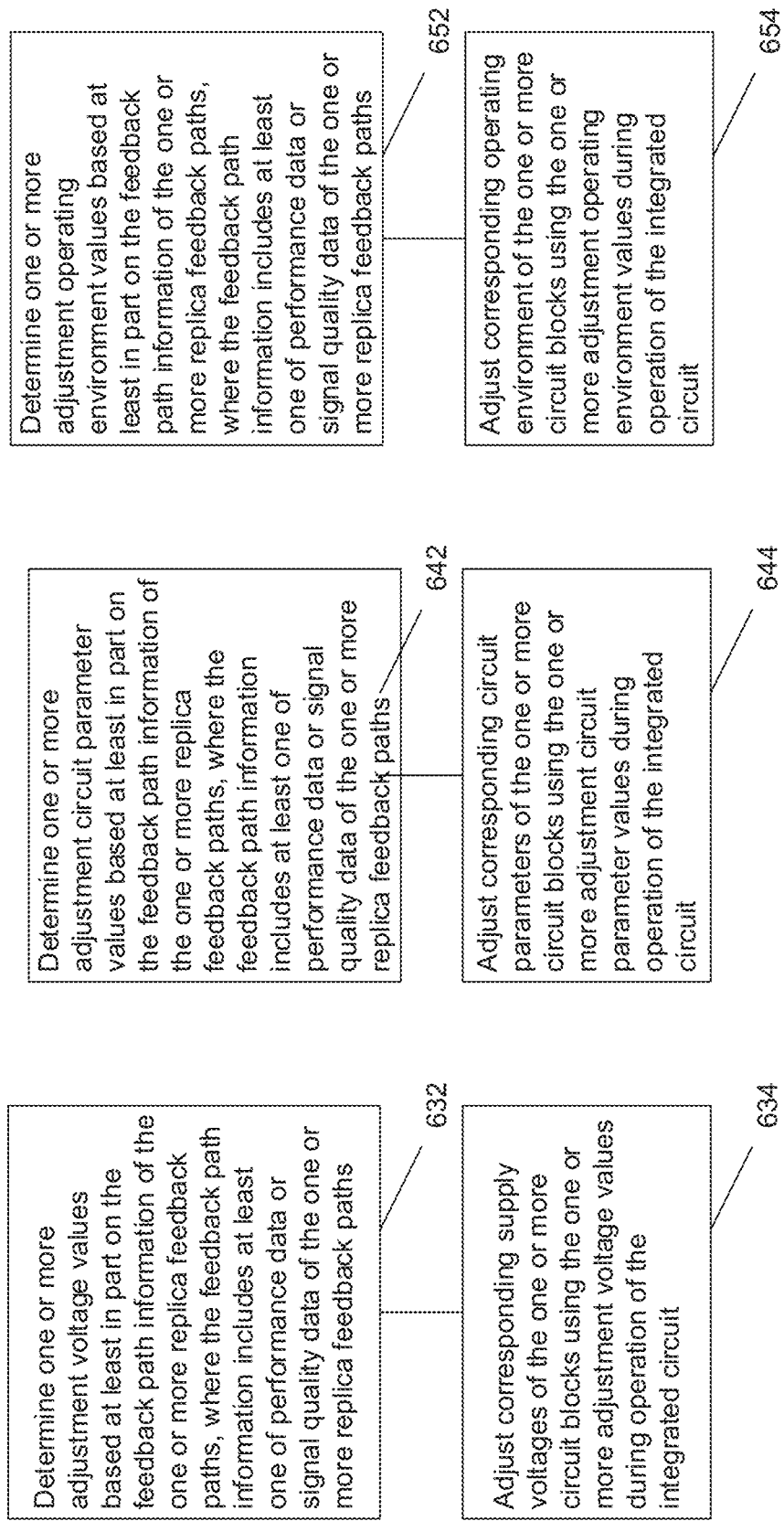

DYNAMIC ADJUSTMENT OF OPERATING CONDITIONS OF INTEGRATED CIRCUITS

CROSS-REFERENCE TO RELATED APPLICATIONS

This application claims the benefit of U.S. patent application No. 62/644,335, "Chip Voltage Supply Calibration," filed Mar. 16, 2018. The aforementioned United States patent application is hereby incorporated by reference in its entirety.

FIELD

The present invention relates to the field of integrated circuits. In particular, the present invention relates to dynamic adjustment of operating conditions of integrated circuits.

BACKGROUND

In conventional integrated circuit design, the performance and other physical behaviors of the integrated circuit are verified by running simulation against mathematical models that represent the integrated circuit. The performance parameters of the integrated circuit are predicted across a wide range of physical, process and environmental conditions. In the design stage, the performance and other physical behaviors of the integrated circuit are designed to meet the worst case performance scenarios and at the same time still satisfy design criteria and target yields in manufacturing.

During manufacturing, due to variations in manufacturing process, temperature and other environmental conditions, the performance and other behaviors of the circuit blocks of the integrated circuit can vary dramatically. Despite such variations, the manufactured integrated circuits may still meet the designed baseline of the worst case performance scenarios. In other words, the manufactured integrated circuits may perform better than the worst case performance scenarios.

Therefore, it is desirable to dynamically adjust the operating conditions of integrated circuits during operation post manufacturing, which in turn can improve performance or lower power consumption of the manufactured integrated circuits.

SUMMARY

Apparatuses and Methods for dynamic adjustment of operating conditions of integrated circuits are provided. In one embodiment, an adjustable integrated circuit may include a plurality of circuit blocks of the integrated circuit designed in accordance with a plurality of design criteria, where one or more circuit blocks in the plurality of circuit blocks include one or more feedback paths, respectively; a circuit performance monitor, where the circuit performance monitor includes one or more replica feedback paths corresponding to the one or more feedback paths in the one or more circuit blocks, and where the circuit performance monitor is configured to monitor feedback path information of the one or more replica feedback paths. The plurality of circuit blocks and the circuit performance monitor are verified to meet the plurality of design criteria and a verified description of the integrated circuit is produced for manufacturing.

The integrated circuit further includes one or more performance adjusters configured to determine one or more adjustment voltage values based at least in part on the feedback path information of the one or more replica feedback paths, where the feedback path information includes at least one of performance data or signal quality data of the one or more replica feedback paths; and adjust corresponding supply voltages of the one or more circuit blocks using the one or more adjustment voltage values during operation of the integrated circuit.

In another embodiment, a method of designing an integrated circuit includes determining a plurality of design criteria of the integrated circuit; designing a plurality of circuit blocks of the integrated circuit in accordance with the plurality of design criteria, where one or more circuit blocks in the plurality of circuit blocks include one or more feedback paths, respectively; designing a circuit performance monitor, where the circuit performance monitor includes one or more replica feedback paths corresponding to the one or more feedback paths in the one or more circuit blocks, and where the circuit performance monitor is configured to monitor feedback path information of the one or more replica feedback paths; verifying the plurality of circuit blocks and the circuit performance monitor to meet the plurality of design criteria; and producing a verified description of the integrated circuit for manufacturing.

In yet another embodiment, a method of dynamically adjusting an operating conditions of an integrated circuit includes receiving, from a voltage reference module, an operating voltage of the integrated circuit, where the operating voltage is distributed in a power grid that drives a plurality of circuit blocks of the integrated circuit; receiving, from a clock generator, a reference clock, where the reference clock is used as an operating frequency of the integrated circuit and is distributed to by the plurality of circuit blocks in the integrated circuit; measuring, by a circuit performance monitor, feedback path timing information of one or more circuit blocks in the plurality of circuit blocks; comparing, by a performance adjuster, the feedback path timing information of the one or more circuit blocks to the reference clock; determining timing margins of corresponding one or more feedback paths of the one or more circuit blocks based on the comparison; and generating, by the performance adjuster, a feedback for adjusting the operating voltage or the operating frequency of the integrated circuit based on the timing margins of the one or more feedback paths of the one or more circuit blocks.

In yet another embodiment, an integrated circuit with dynamically adjustable operating conditions includes a power grid configured to receive an operating voltage of the integrated circuit from a voltage reference module, where the operating voltage is distributed to drive a plurality of circuit blocks of the integrated circuit; a clock generator configured to receive a reference clock, where the reference clock is used as an operating frequency of the integrated circuit and is distributed to by the plurality of circuit blocks in the integrated circuit; a circuit performance monitor configured to measure feedback path timing information of one or more circuit blocks in the plurality of circuit blocks; and a performance adjuster configured to compare the feedback path timing information of the one or more circuit blocks to the reference clock, determine timing margins of corresponding one or more feedback paths of the one or more circuit blocks based on the comparison, and generate a feedback for adjusting the operating voltage or the operating frequency of the integrated circuit based on the timing margins of the one or more feedback paths of the one or more circuit blocks.

BRIEF DESCRIPTION OF THE DRAWINGS

The aforementioned features and advantages of the disclosure, as well as additional features and advantages thereof, will be more clearly understandable after reading detailed descriptions of embodiments of the disclosure in conjunction with the non-limiting and non-exhaustive aspects of following drawings. Like numbers are used throughout the specification.

FIG. 2A illustrates an exemplary implementation of an adjustable integrated circuit according to aspects of the present disclosure.

FIG. 6B illustrates an exemplary method of designing a performance data collector according to aspects of the present disclosure.

FIG. 6C illustrates an exemplary method of designing a signal quality data collector according to aspects of the present disclosure.

FIG. 6D illustrates an exemplary method of designing a performance adjuster according to aspects of the present disclosure.

FIG. 6E illustrates an exemplary method of designing a circuit parameter controller according to aspects of the present disclosure.

FIG. 6F illustrates an exemplary method of designing an operating environment controller according to aspects of the present disclosure.

DESCRIPTION OF EMBODIMENTS

Apparatuses and Methods for dynamic adjustment of operating conditions of integrated circuits are provided. The following descriptions are presented to enable a person skilled in the art to make and use the disclosure. Descriptions of specific embodiments and applications are provided only as examples. Various modifications and combinations of the examples described herein will be readily apparent to those skilled in the art, and the general principles defined herein may be applied to other examples and applications without departing from the scope of the disclosure. Thus, the present disclosure is not intended to be limited to the examples described and shown, but is to be accorded the scope consistent with the principles and features disclosed herein. The word "exemplary" or "example" is used herein to mean "serving as an example, instance, or illustration." Any aspect or embodiment described herein as "exemplary" or as an "example" in not necessarily to be construed as preferred or advantageous over other aspects or embodiments.

Figure 1A:
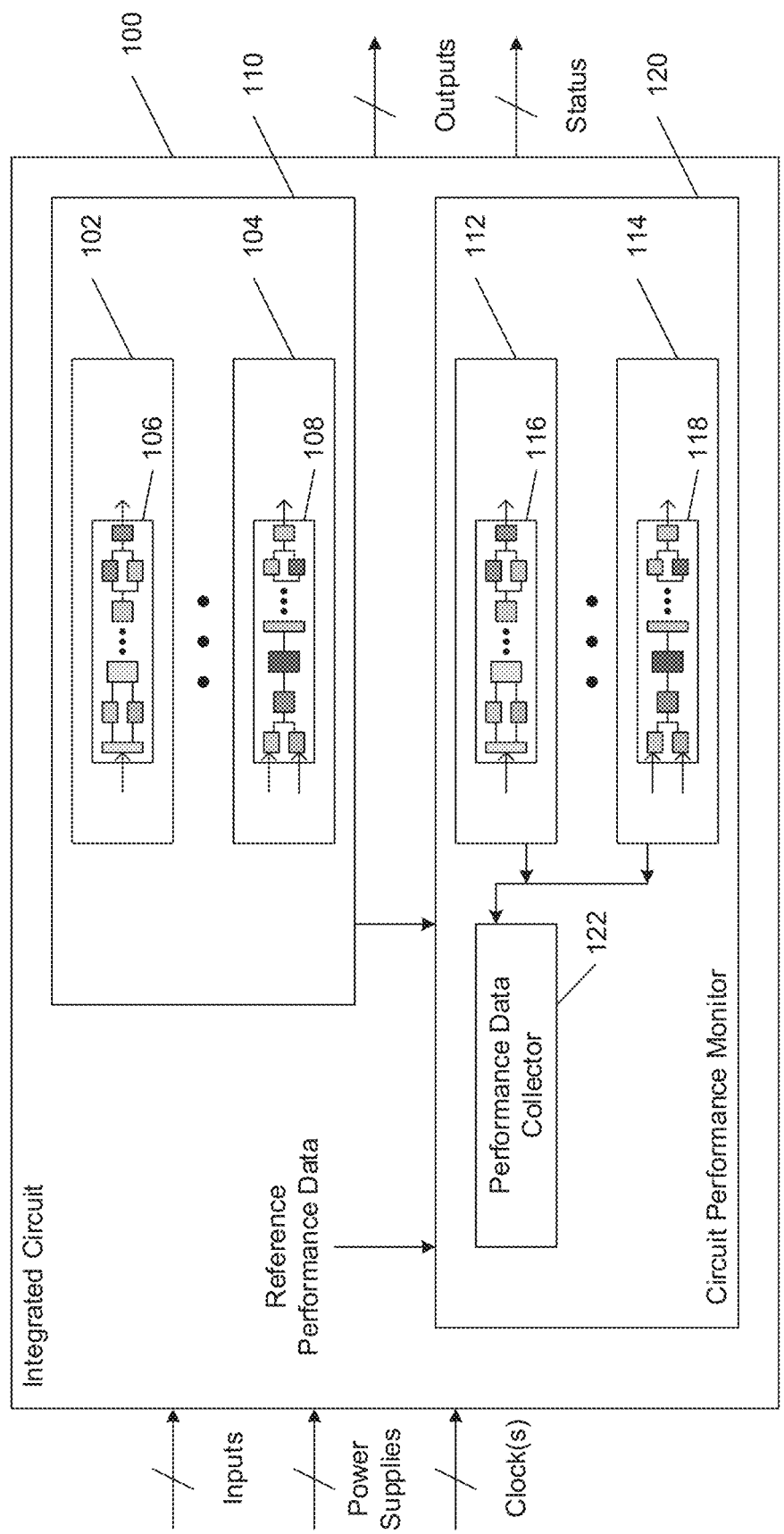
FIG. 1A illustrates an exemplary implementation of an integrated circuit according to aspects of the present disclosure.

FIG. 1A illustrates an exemplary implementation of an integrated circuit according to aspects of the present disclosure. As shown in the example of FIG. 1A, the integrated circuit 100 may include multiple circuit blocks shown as 110. One or more of circuit blocks in the multiple circuit blocks, such as circuit blocks 102 and 104, may include their corresponding feedback paths. For example, circuit block 102 may include a feedback path 106, and circuit block 104 may include a feedback path 108. According to aspects of the present disclosure, a feedback path may represent a critical path of a circuit block in some implementations. In other implementations, a feedback path may represent a group of electrically connected circuit components of interest.

The integrated circuit may further include a circuit performance monitor 120, which in turn may include one or more replica feedback paths of one or more replica circuit blocks (such as 112 and 114) corresponding to the one or more feedback paths in the one or more circuit blocks. For example, replica feedback path 116 may be configured to match the performance of feedback path 106, and replica feedback path 118 may be configured to match the performance of feedback path 108. The circuit performance monitor 120 is configured to monitor feedback path information of the one or more replica feedback paths. In some implementations, the replica feedback paths may be placed close to their corresponding feedback paths, for example the replica feedback path 116 may be placed in close proximity with the feedback path 106. In other implementations, the replica feedback paths may be distributed throughout the integrated circuit 100, for example the replica feedback path 118 may be placed not in close proximity with the feedback path 108 but in other parts of the integrated circuit 100. In yet other implementations, the replica feedback paths may be placed together as a group for convenience of access and control.

According to aspects of the present disclosure, the circuit performance monitor 120 may include a performance data collector 122. The performance data collector 122 may be configured to collect measured performance data of the one or more replica feedback paths, compare the measured performance data to a set of reference performance data, and generate performance differences between the measured performance data and the set of reference performance data based on the comparison. According to aspects of the present disclosure, the integrated circuit 100 is designed to meet various design criteria. The integrated circuit 100 may receive inputs, power supply voltages, and reference clocks, and the integrated circuit 100 may in turn using the inputs, power supply voltages, and reference clocks to produce outputs and statuses, such as the data collected and generated by the circuit performance monitor 120.

Figure 1B:
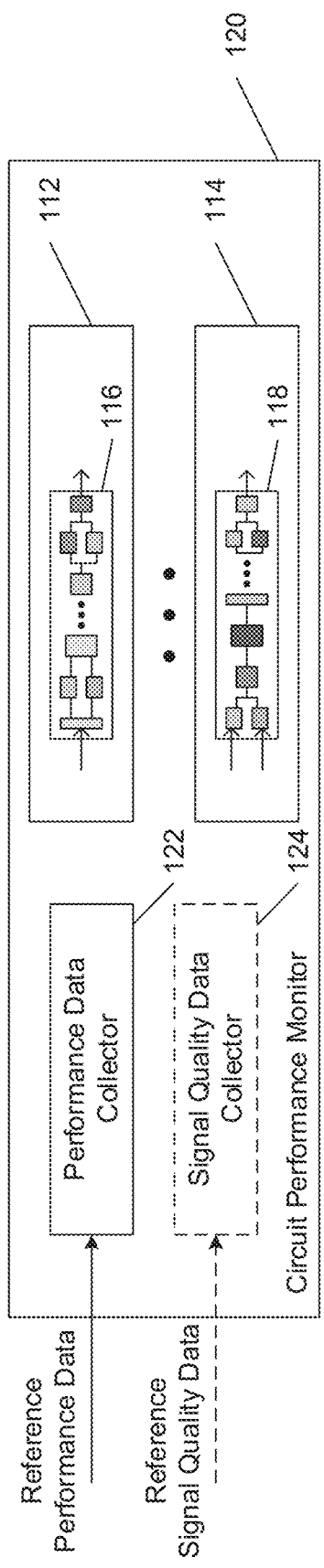
FIG. 1B illustrates another exemplary implementation of the circuit performance monitor of the integrated circuit of FIG. 1A according to aspects of the present disclosure.

FIG. 1B illustrates another exemplary implementation of the circuit performance monitor of the integrated circuit of FIG. 1A according to aspects of the present disclosure. Note that some of the components of the circuit performance monitor 120 shown in FIG. 1B may be substantially similar to the components of the circuit performance monitor 120 shown in FIG. 1A, and the descriptions of these components are skipped herein for simplicity. As shown in FIG. 1B, the circuit performance monitor may additionally or optionally include a signal quality data collector 124. The signal quality data collector 124 may be configured to collect measured signal quality data of the one or more replica feedback paths, compare the measured signal quality data to a set of reference signal quality data, and generate signal quality differences between the measured signal quality data and the set of reference signal quality data based on the comparison.

FIG. 2A illustrates an exemplary implementation of an adjustable integrated circuit according to aspects of the present disclosure. Note that some of the components of the adjustable integrated circuit 200 may be substantially similar to the components of the integrated circuit 100 shown in FIG. 1A and FIG. 1B, and the descriptions of these components are skipped herein for simplicity. In the exemplary implementation shown in FIG. 2A, the integrated circuit 200 may further include a circuit performance controller 202, which may include one or more performance adjusters 204. According to aspects of the present disclosure, the one or more performance adjusters 204 may be configured to determine one or more adjustment voltage values based at least in part on the feedback path information of the one or more replica feedback paths received from the circuit performance monitor 120, and adjust corresponding supply voltages of the one or more circuit blocks, for example circuit blocks 102 and 104, using the one or more adjustment voltage values measured during operation of the integrated circuit 200.

In some implementations, the one or more performance adjusters 204 may be configured to determine one or more operating frequency values based at least in part on the feedback path information of the one or more replica feedback paths, where the feedback path information includes at least one of performance data or signal quality data of the one or more replica feedback paths, and adjust corresponding operating frequencies of the one or more circuit blocks using the one or more operating frequency values during operation of the integrated circuit. The one or more performance adjusters 204 may be further configured to detect deviations of the operating frequencies of the one or more circuit blocks during operation of the integrated circuit, determine one or more adjustment operating frequency values based at least in part on the deviations of the operating frequencies detected, and adjust corresponding operating frequencies of the one or more circuit blocks using the one or more adjustment operating frequency values.

The feedback path information may include at least one of performance data or signal quality data of the one or more replica feedback paths. In some implementations, the feedback path information may include performance differences between the measured performance data and a set of reference performance data generated by the performance data collector, and/or signal quality differences between the measured signal quality data and a set of reference signal quality data generated by the signal quality collector.

Figure 2B:
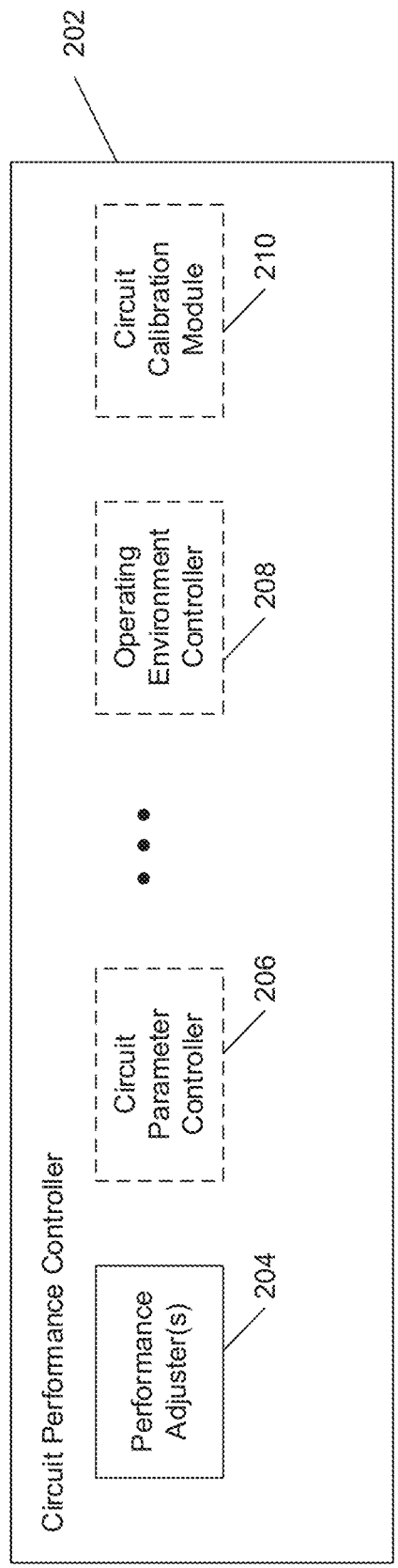
FIG. 2B illustrates an exemplary implementation of the circuit performance controller of FIG. 2A according to aspects of the present disclosure.

FIG. 2B illustrates an exemplary implementation of the circuit performance controller of FIG. 2A according to aspects of the present disclosure. Note that the one or more performance adjusters 204 may be substantially similar to the same shown in FIG. 2A, and the descriptions of the one or more performance adjusters 204 are skipped herein for simplicity. As shown in FIG. 2B, the circuit performance controller 202 may further include a circuit parameter controller 206, an operating environment controller 208, a circuit calibration module 210, or other controllers for controlling the integrated circuit 200.

According to aspects of the present disclosure, the circuit parameter controller 206 may be configured to determine one or more adjustment circuit parameter values based at least in part on the feedback path information of the one or more replica feedback paths, and adjust corresponding circuit parameters of the one or more circuit blocks using the one or more adjustment circuit parameter values during operation of the integrated circuit. In some implementations, the circuit parameters of the one or more circuit blocks includes at least one of: threshold voltages of the one or more circuit blocks, power usage of the one or more circuit blocks, electrical impedance of the one or more circuit blocks, operating frequencies of the one or more circuit blocks, or a combination thereof. In some implementations, the circuit performance controller 202 can be further configured to predict an overall performance of the integrated circuit post manufacturing, based on the feedback path information of the one or more replica feedback paths.

According to aspects of the present disclosure, the operating environment controller 208 may be configured to determine one or more adjustment operating environment values based at least in part on the feedback path information of the one or more replica feedback paths, and adjust corresponding operating environment of the one or more circuit blocks using the one or more adjustment operating environment values during operation of the integrated circuit. In some implementations, the operating environment of the one or more circuit blocks may include corresponding at least one of temperatures or thermal impedance of the one or more circuit blocks. In some implementations, the feedback path information may include performance differences between the measured performance data and a set of reference performance data generated by the performance data collector, and/or signal quality differences between the measured signal quality data and a set of reference signal quality data generated by the signal quality collector.

According to aspects of the present disclosure, the circuit calibration module 210 may be configured to perform a number of calibration modes, namely a full calibration mode, a short calibration mode, or no calibration.

For the full calibration mode, it may be performed at the first time power up of the integrated circuit, where the calibration may start from the beginning (where VDD may be set at full supply). This mode may be desirable when the integrated circuit is powered up or when a clock frequency has changed, or when there are significant changes in applications.

For the short calibration mode, it may be performed after each of the writing in the pre-load value or recalibrating from previous locked value. This mode may be used when the integrated circuit is powered up from last time it has been locked.

For no calibration, it may use pre-load value as is, since pre-load value (from last time it is locked) has some margin built in, unless there is significant changes since last time it locked, by using pre-load value as is may give enough margin in the supply to cover the feedback path timing. This mode may be used when the integrated circuit is only powered up for a short time before it is being shut down again.

In some implementations, the integrated circuit may include a tracking mode. For example, during operation there may be changes in the temperature, voltage and/or application activity that are different than the point of the loop was being calibrated, based on various mechanisms that track these changes. For temperature fluctuations, the circuits used in the design may include a built-in self-compensation and may be adapted to the new temperature without re-calibrating. If an application changes that introduces significant impact to the supply, in such cases, it may be desirable to periodically recalibrate using the short calibration loop. For a long period of operation, there may be a drift in the main power supply generated by a voltage reference module. To compensate for this drifting effect, the short recalibrating mode can be used. According to aspects of the present disclosure, the circuit calibration module 210 can be enabled interactively to monitor the effect of the changes described above, and to provide the trigger of a recalibration event.

Figure 3A:
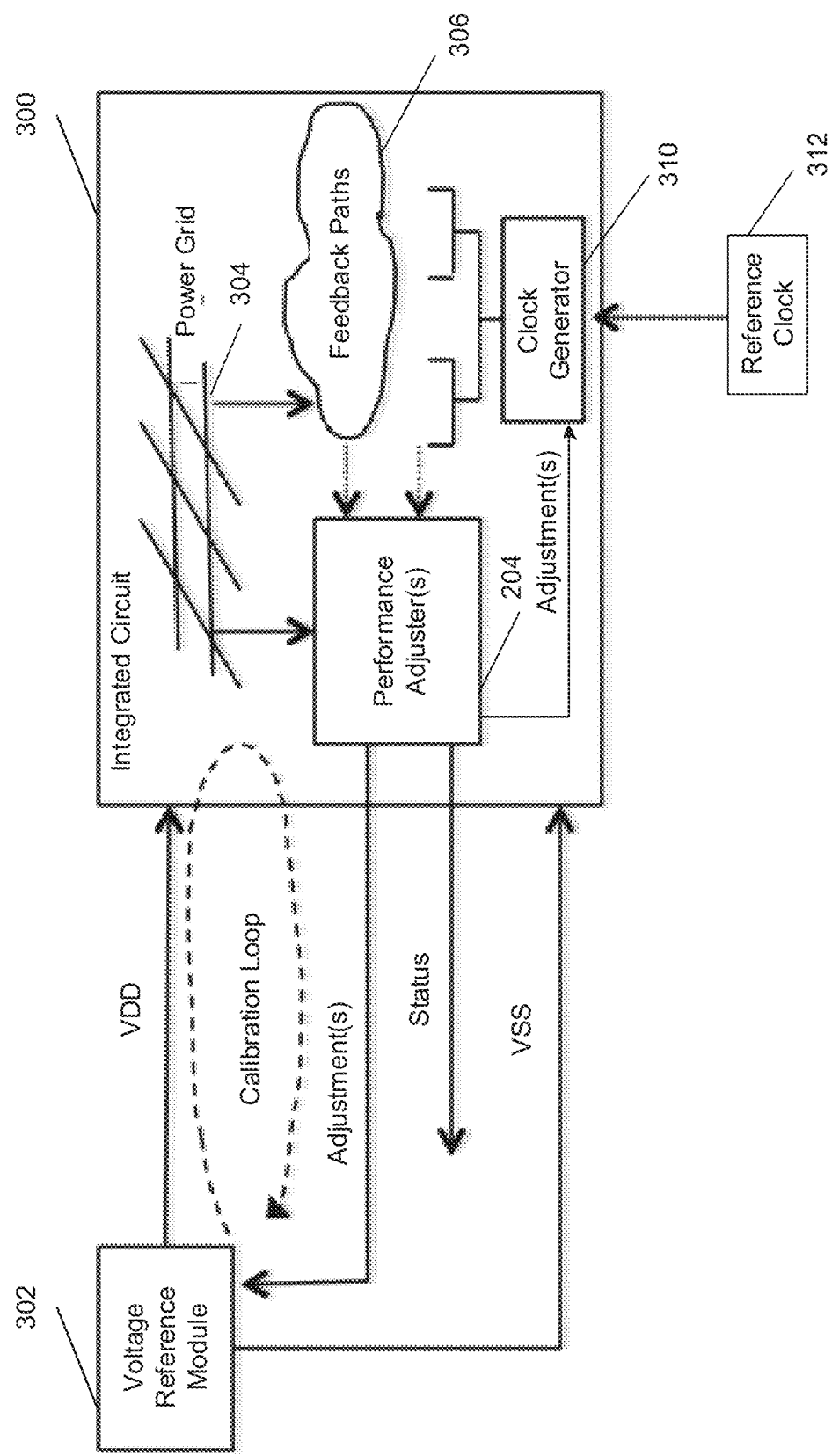
FIG. 3A illustrates an exemplary application of a performance adjuster according to aspects of the present disclosure.

FIG. 3A illustrates an exemplary application of a performance adjuster according to aspects of the present disclosure. In the exemplary application of FIG. 3A, an integrated circuit 300 may be configured to receive an operating voltage from a voltage reference module 302. The received operating voltage may be distributed by a power grid 304 to supply power to the rest of the integrated circuit 300, such as to the one or more feedback paths 306 and the performance adjuster 204. The operating voltage includes a first voltage (VDD) indicative of power and a second voltage (VSS) indicative of a circuit ground. The integrated circuit 300 may further include a clock generator 310, which may be configured to receive a reference clock from a reference clock module 312. According to aspects of the present disclosure, the reference clock may be used to produce the operating frequency of the integrated circuit. The clock generator 310 may also be configured to receive adjustment(s) or feedback from the performance adjuster 204 for adjusting the operating frequency of the integrated circuit 300.

According to aspects of the present disclosure, the performance adjuster 204 may be configured to receive one or more feedback path delays of corresponding one or more circuit blocks in the integrated circuit 300, compare the one or more feedback path delays of the one or more circuit blocks to the reference clock, determine timing margins of the one or more feedback paths of the one or more circuit blocks, generate a feedback for adjusting the operating voltage or the operating frequency of the integrated circuit based on the timing margins of the one or more feedback paths of the one or more circuit blocks. The integrated circuit 300 may be configured to receive, from the voltage reference module 302, an updated operating voltage, where the updated operating voltage is generated in accordance with the adjustment(s) or feedback provided by the performance adjuster 204. In this way, a calibration loop is formed between the integrated circuit 300 and the voltage reference module 302, and in particular among the voltage reference module 302, power grid 304, feedback paths 306, and the performance adjuster 204. Note that in some implementations, the performance adjuster may provide status information to other parts of the integrated circuit 300 or to other components outside of the integrated circuit 300.

Figure 3B:
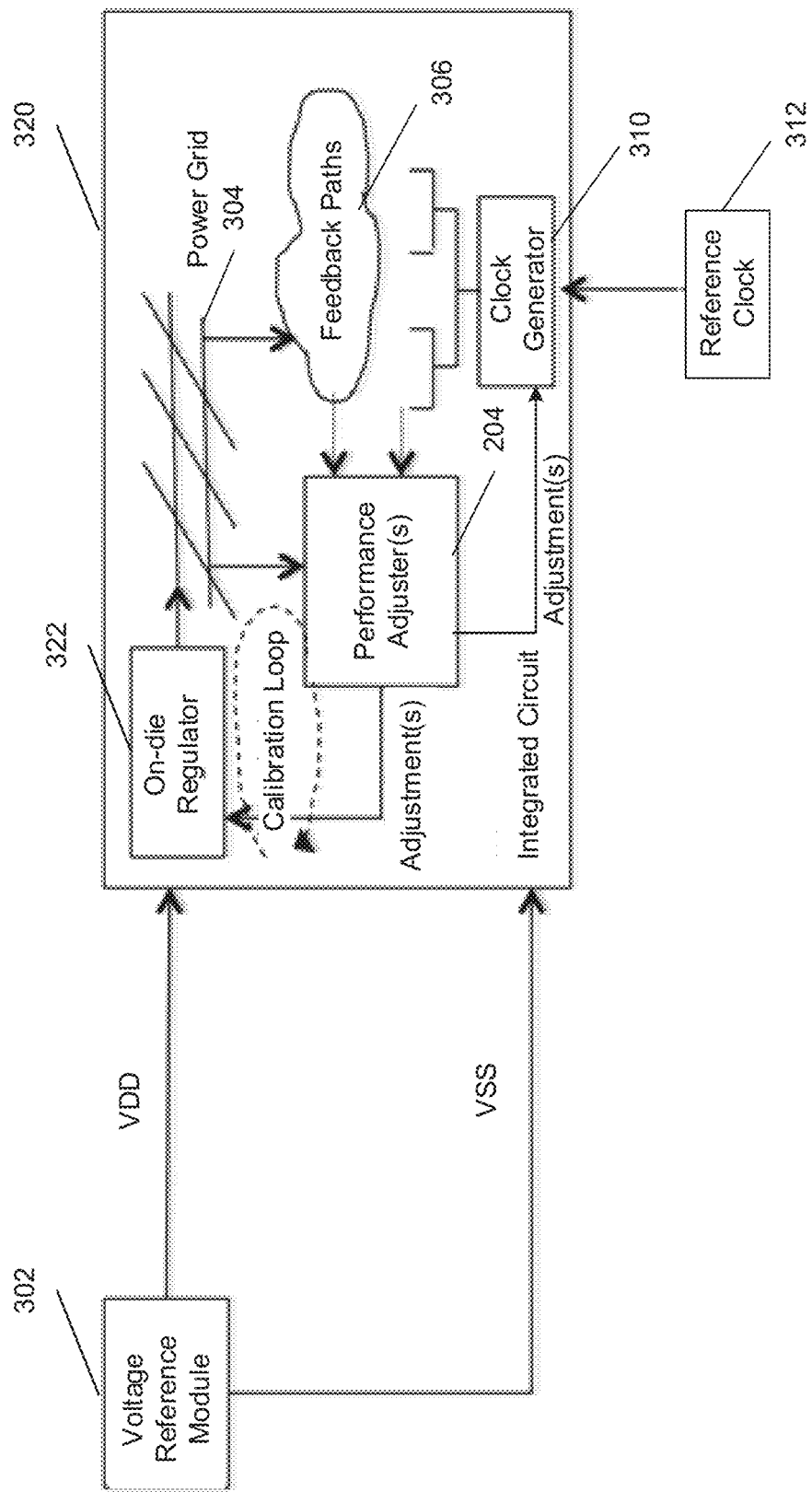
FIG. 3B illustrates another exemplary application of a performance adjuster according to aspects of the present disclosure.

FIG. 3B illustrates another exemplary application of a performance adjuster according to aspects of the present disclosure. As shown in FIG. 3B, an integrated circuit 320 may be configured to receive an operating voltage from a voltage reference module 302. The received operating voltage is received through an on-die regulator 322, and then distributed by a power grid 304 to supply power to the rest of the integrated circuit 320, such as to the one or more feedback paths 306 and to the performance adjuster 204. The operating voltage includes a first voltage (VDD) indicative of power and a second voltage (VSS) indicative of a circuit ground. The integrated circuit 320 may further include a clock generator 310, which may be configured to receive a reference clock from a reference clock module 312, and/or to receive adjustment(s) or feedback from the performance adjuster 204 for adjusting the operating frequency of the integrated circuit 300, similar to the exemplary application as described in association with FIG. 3A.

According to aspects of the present disclosure, the performance adjuster 204 may be configured to receive one or more feedback path delays of corresponding one or more circuit blocks in the integrated circuit 320, compare the one or more feedback path delays of the one or more circuit blocks to the reference clock, determine timing margins of the one or more feedback paths of the one or more circuit blocks, generate a feedback for adjusting the operating voltage or the operating frequency of the integrated circuit based on the timing margins of the one or more feedback paths of the one or more circuit blocks. The on-die regulator 322 may be configured to receive the feedback from the performance adjuster 204 for adjusting the operating voltage, and generate an updated operating voltage using the operating voltage received from the voltage reference module 302 and the feedback received from the performance adjuster 204. In this way, a calibration loop is formed within the integrated circuit 320, in particular, among the on-die regulator 322, power grid 304, feedback paths 306, and the performance adjuster 204.

Figure 4A:
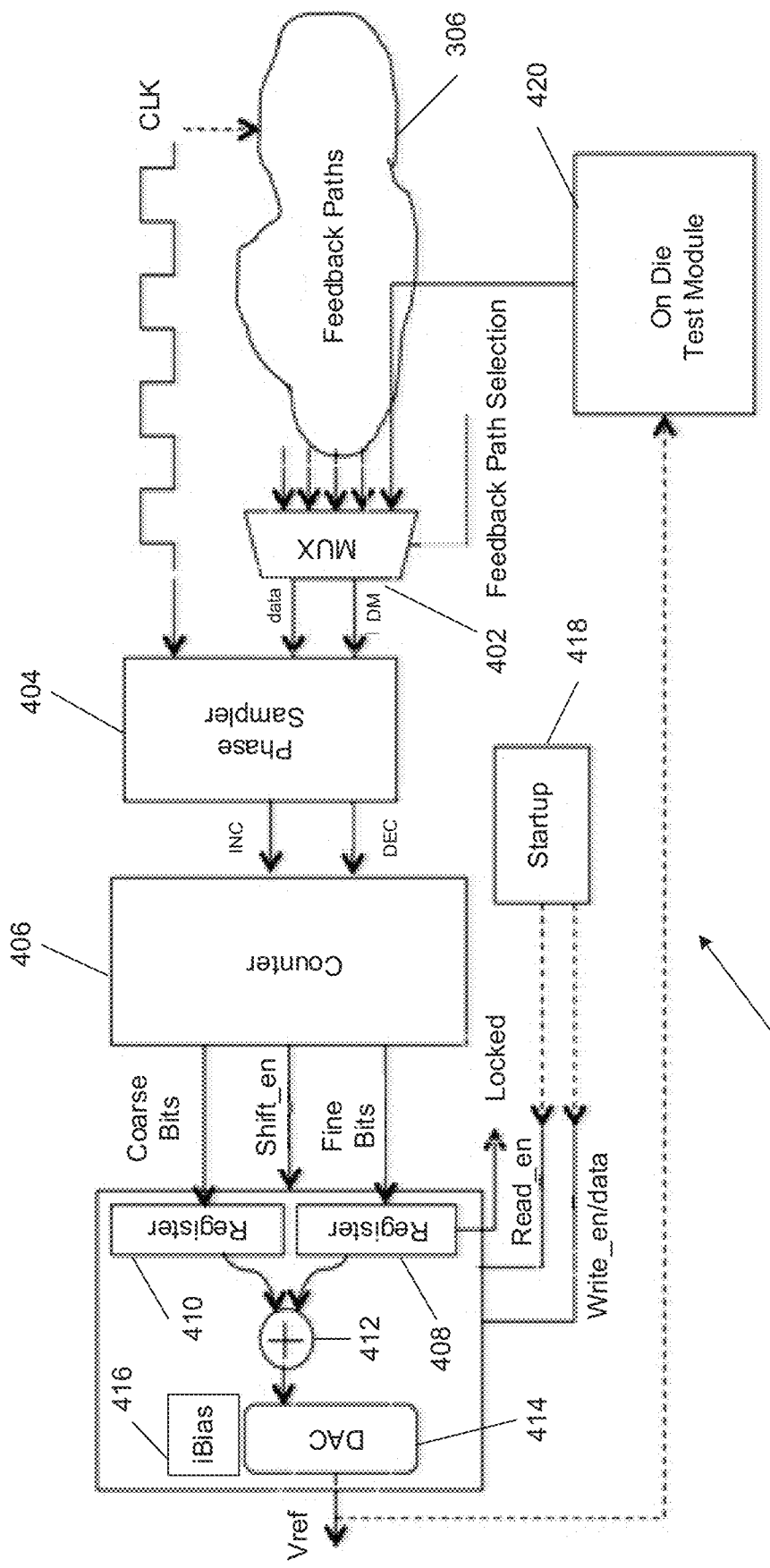
FIG. 4A illustrates an exemplary implementation of a performance adjuster according to aspects of the present disclosure.

FIG. 4A illustrates an exemplary implementation of a performance adjuster according to aspects of the present disclosure. In the exemplary implementation shown in FIG. 4A, the performance adjuster 204 may include a multiplexer 402, a phase sampler 404, a counter 406, a fine-shift register 408, a coarse-shift register 410, a summation unit 412, a digital to analog converter 414, a current bias 416 and a startup module 418. The performance adjuster 204 may also be configured to receive input(s) from an on-die test module 420 and provide feedback to the on-die test module 420.

In one embodiment, at a given time one of the feedback path delay from the feedback paths 306 may be selected by the multiplexer 402 through the input selection to generate data related to the feedback path delay and a corresponding data make (DM). The selected feedback path delay information is compared to the clock cycle time with the phase sampler 404. The phase sampler 404 generates two complemented output signals, namely increase (INC) and decrease (DEC). If the feedback path delay is shorter than one period of a reference clock cycle, the decrement signal is asserted (logic high); if the feedback path delay is longer than one period of the reference clock cycle, the increment signal is asserted (logic high).

The increment and decrement signals are fed into the counter 406, which performs the function of a digital loop filter. In one implementation, upon detecting 5 out of 8 decrement samples, the 4-bit binary decrement counter may count up by 1. When 4-bit decrement counter reaches to 16 counts, it may shift up the fine-shift register 408 by 1, the 4-bit binary decrement counter may then be reset and starts the counting again. When the fine-shift register 408 reaches all 1's, it may shift the coarse-shift register 410 up by 1 and the fine-shift register 408 may then be reset to 0, and the loop starts over. In other implementations, different counter, fine-shift register, and coarse-shift register sizes may be used to record the behaviors of the feedback paths.

Similarly, when there are five samples of 0's detected out of 8 samples, the 4-bit increment counter may count up by 1. The increment counter may then be reset and starts the counting again. When 4-bit increment counter reaches to 16 counts, it may shift down the fine-shift register 408 by 1, the 4-bit binary increment counter may then be reset and starts the count again. If the fine-shift register 408 reaches all 0's, the coarse-shift register 410 may be shifted down by 1, and the fine-shift register 408 may be reset to all 1's and the loop starts over.

The analog Vref level may be generated by summing, using the summation unit 412, values of the coarse-shift register 410 and the fine-shift register 408 bits, and then the digital values is converted to an analog value using the DAC 414.

In some embodiments, the weight of all fine bits may be equivalent to one coarse bit. The feedback path delay drifting due to temperature or activity may also be tracked using same fine and coarse calibration loops as described above.

After 8 consecutive times of no majority vote from data sampling of increment and decrement, the performance adjuster 204 may issue a lock signal (lock=high) and calibration is completed.

Figure 4B:
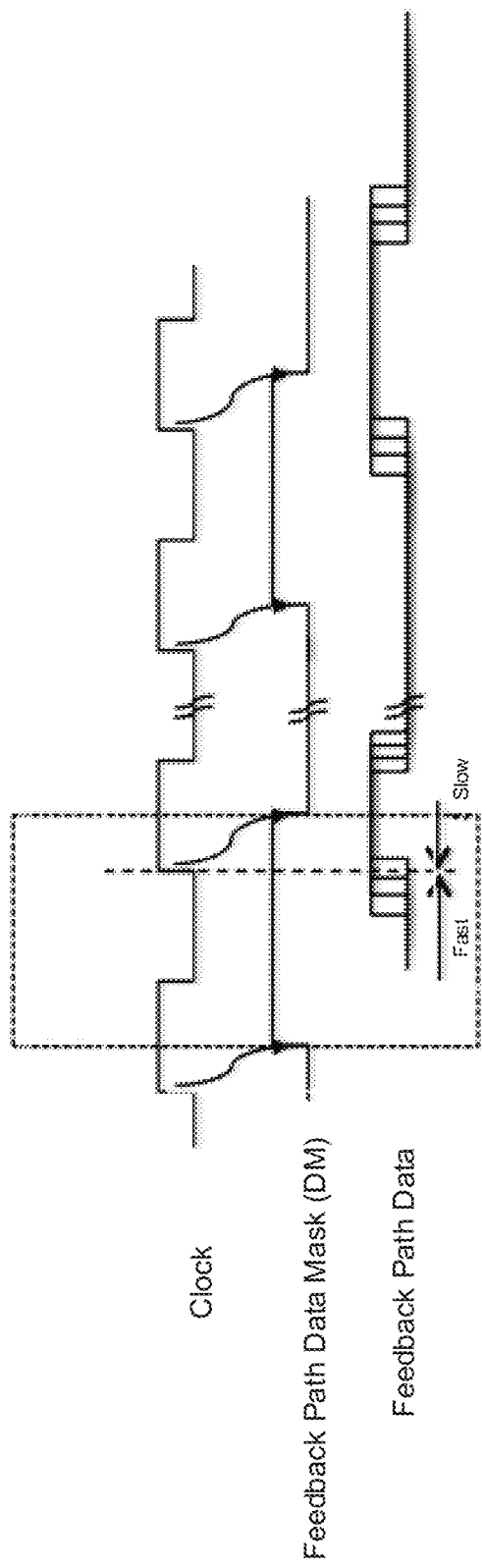
FIG. 4B illustrates an example of a phase sampler timing diagram according to aspects of the present disclosure.

FIG. 4B illustrates an example of a phase sampler timing diagram according to aspects of the present disclosure. As shown in FIG. 4B, the feedback path data may be compared to the clock cycle time. The feedback path provides a delay signal and its associated data mask (DM) to the phase sampler 404. Each time the phase sampler 404 observes the DM signal transitions to high, it compares the feedback path delay with the clock period and outputs a signal of a fast (e.g., DEC is asserted) or a slow (e.g., INC is asserted) indicator to the counter 406.

Note that the feedback path data and its data mask may not need to be generated at every clock cycle, as long as the performance adjuster can gather sufficient sampling data to generate the output reference voltage (Vref) within a time period. Therefore, the more data gathered from the feedback paths 306, the faster the voltage calibration can be completed.

Figure 4C:
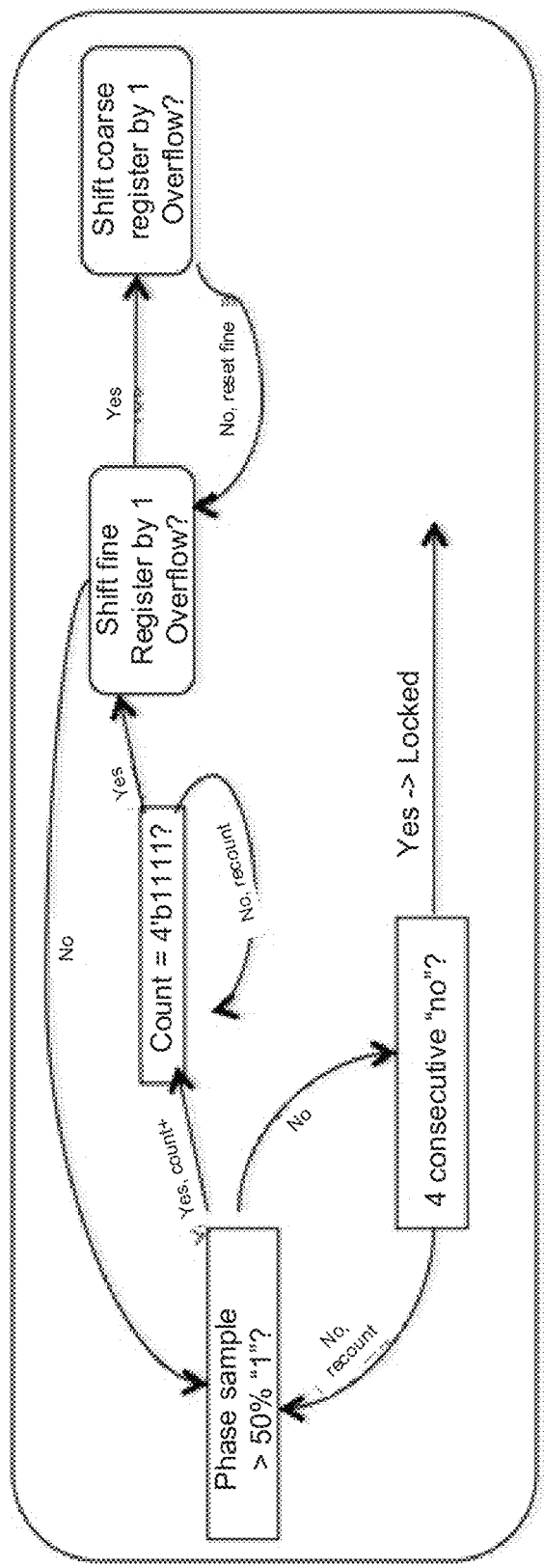
FIG. 4C illustrates an exemplary implementation of phase sampler control logic according to aspects of the present disclosure.

FIG. 4C illustrates an exemplary implementation of phase sampler control logic according to aspects of the present disclosure. In the example of FIG. 4C, a loop filter finite state machine diagram is shown. As described above, when the phase sampler 404 detects majority increment or decrement out of 8 samples, it may trigger the increment or decrement 4-bit binary counter up by 1. When the counter 406 reaches 16 counts, it may shift the fine-shift-register up by 1 for decrement counter, or down by 1 for increment counter, then the counter may be reset and starts over. After the fine-shift register 408 reaches all 1's or all 0's, it may trigger the coarse-shift register 410 to shift up by 1 or shift down by one respectively, the fine-shift register 408 may then be reset and start counting again. If the performance adjuster 204 does not detect majority (not sufficient votes) increment or decrement from 8 samples for a consecutive 4 times, it may issue the lock signal and the calibration is completed.

Figure 4D:
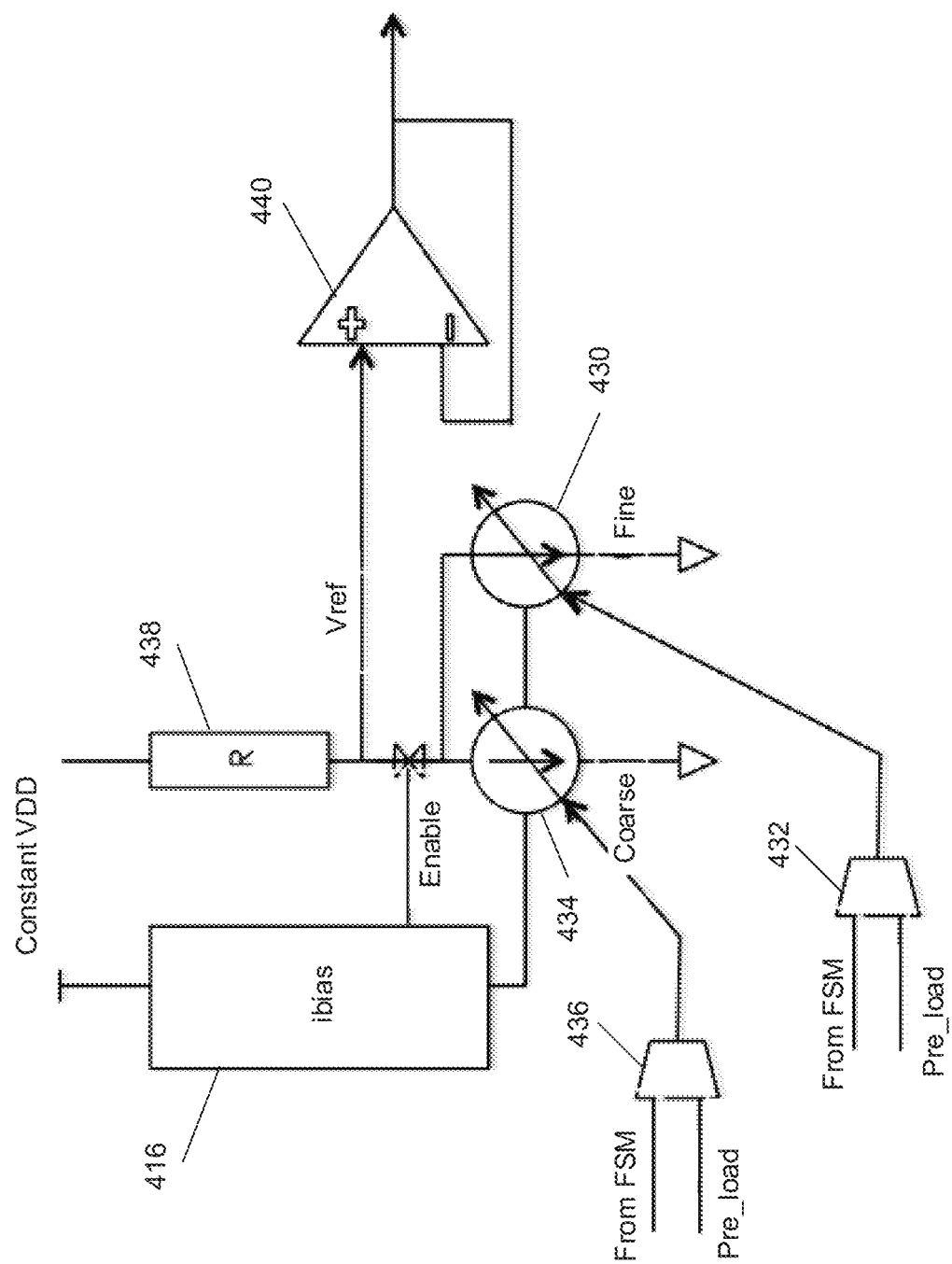
FIG. 4D illustrates an exemplary implementation of a digital-to-analog converter and summation of coarse bits and fine bits according to aspects of the present disclosure.

FIG. 4D illustrates an exemplary implementation of a digital-to-analog converter and summation of coarse bits and fine bits according to aspects of the present disclosure. As shown in FIG. 4D, the implementation includes a current bias 416, a fine adjustable current source 430, a fine adjustment selector 432, a coarse adjustable current source 434, a coarse adjustment selector 436, a load 438, and a feedback amplifier 440 for driving Vref to outside of the performance adjuster 204. The reference voltage (Vref) may be generated by a DAC with summing of coarse and fine bits. In some implementations, there may be an option of direct loading pre-calibrated value of fine and coarse bits to the DAC without going through calibration.

Figure 4E:
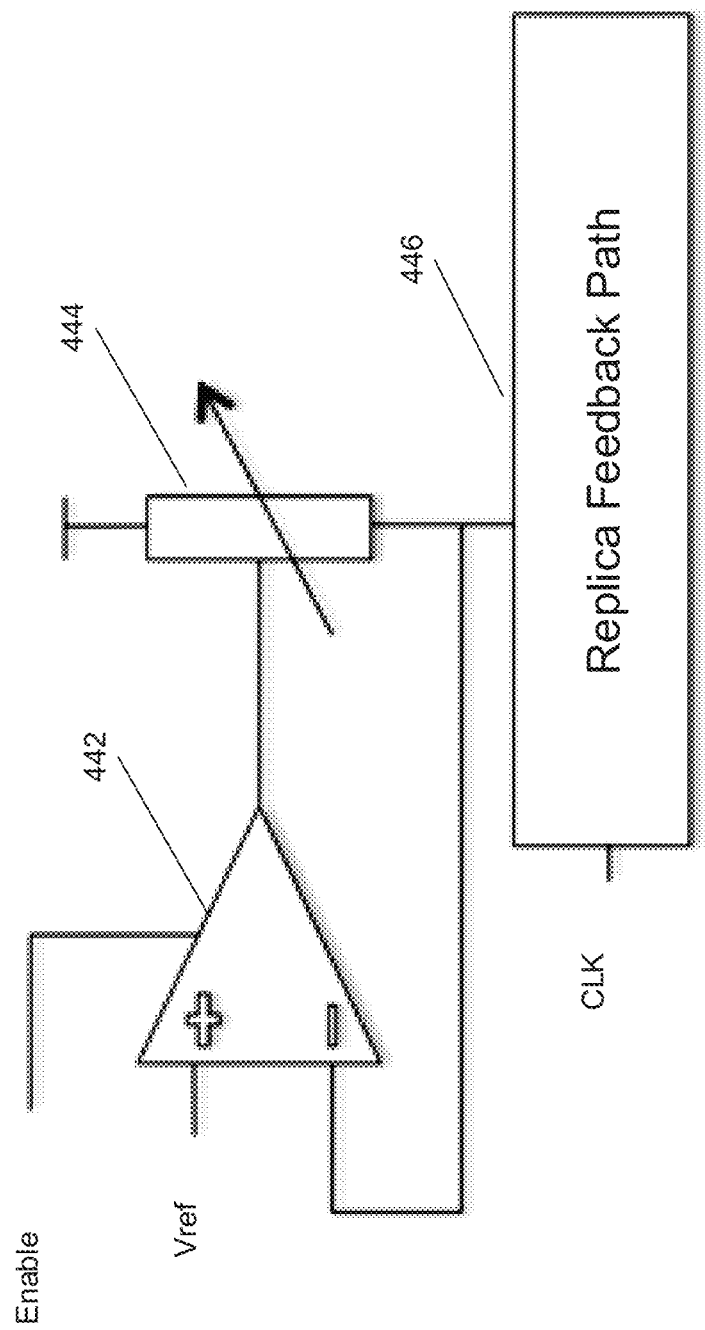
FIG. 4E illustrates an exemplary implementation of an on-die testing and self-calibration module according to aspects of the present disclosure.

FIG. 4E illustrates an exemplary implementation of an on-die testing and self-calibration module according to aspects of the present disclosure. In the example of FIG. 4E, the implementation may include a feedback amplifier 442, a variable load 444, and a replica feedback path 446. The replica feedback path 446 operated under its own regulated supply, the loop may calibrate this local regulated supply until it meets the frequency target. According to aspects of the present disclosure, the on-die testing and self-calibration module is configured to test the voltage supply regulating scheme without involving the actual change in the power supply. This module can be used to calibrate the local regulated supply without effecting the main power supply. The calibration is completed, the digital codes of the calibration can be stored or read out for information, or can be fed back for setting the supply voltage of the integrated circuit. The on-die testing and self-calibration module may also be used to monitor the change in the supply and trigger the recalibration when needed. The on-die testing and self-calibration module may be part of the circuit calibration module described above in association with FIG. 2B.

Figure 5A:
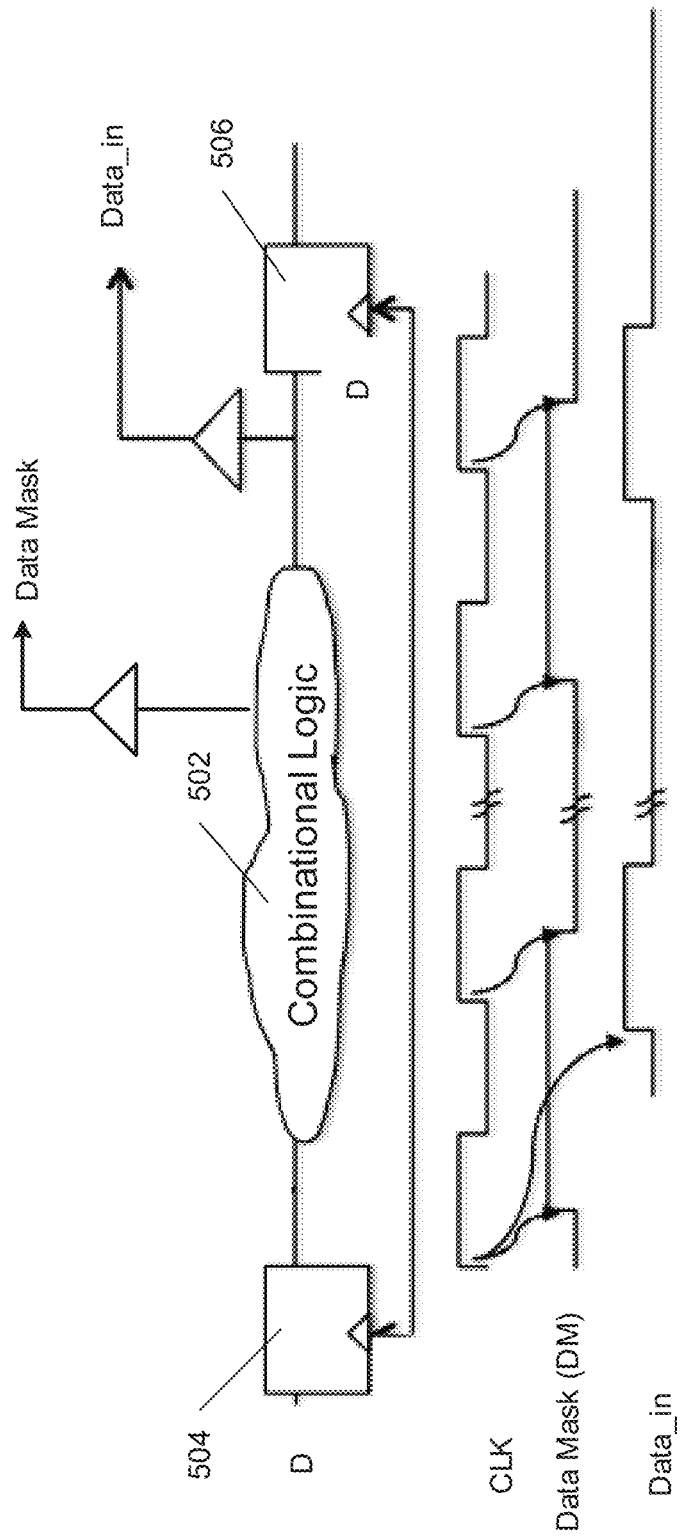
FIG. 5A illustrates an exemplary implementation of feedback path data and data mask generation according to aspects of the present disclosure.

FIG. 5A illustrates an exemplary implementation of feedback path data and data mask generation according to aspects of the present disclosure. In the exemplary implementation of FIG. 5A, a combinational logic 502 that represent a crucial path or a replica feedback path may be placed between D flip flops, namely 504 and 506. The data mask signal may be taken from the output of D flip flop 504 before it reaches the combination logic 502. The data_in signal may be taken from the output of the combinational logic 502 before the input of the D flip flop 506. The data_in signal may represent the feedback path data according to aspects of the present disclosure. Note that when voltage calibration mode is enabled, this enable signal is sent to feedback path (or a corresponding replica feedback path) to send back the data and data mask signals to the performance adjuster.

Figure 5B:
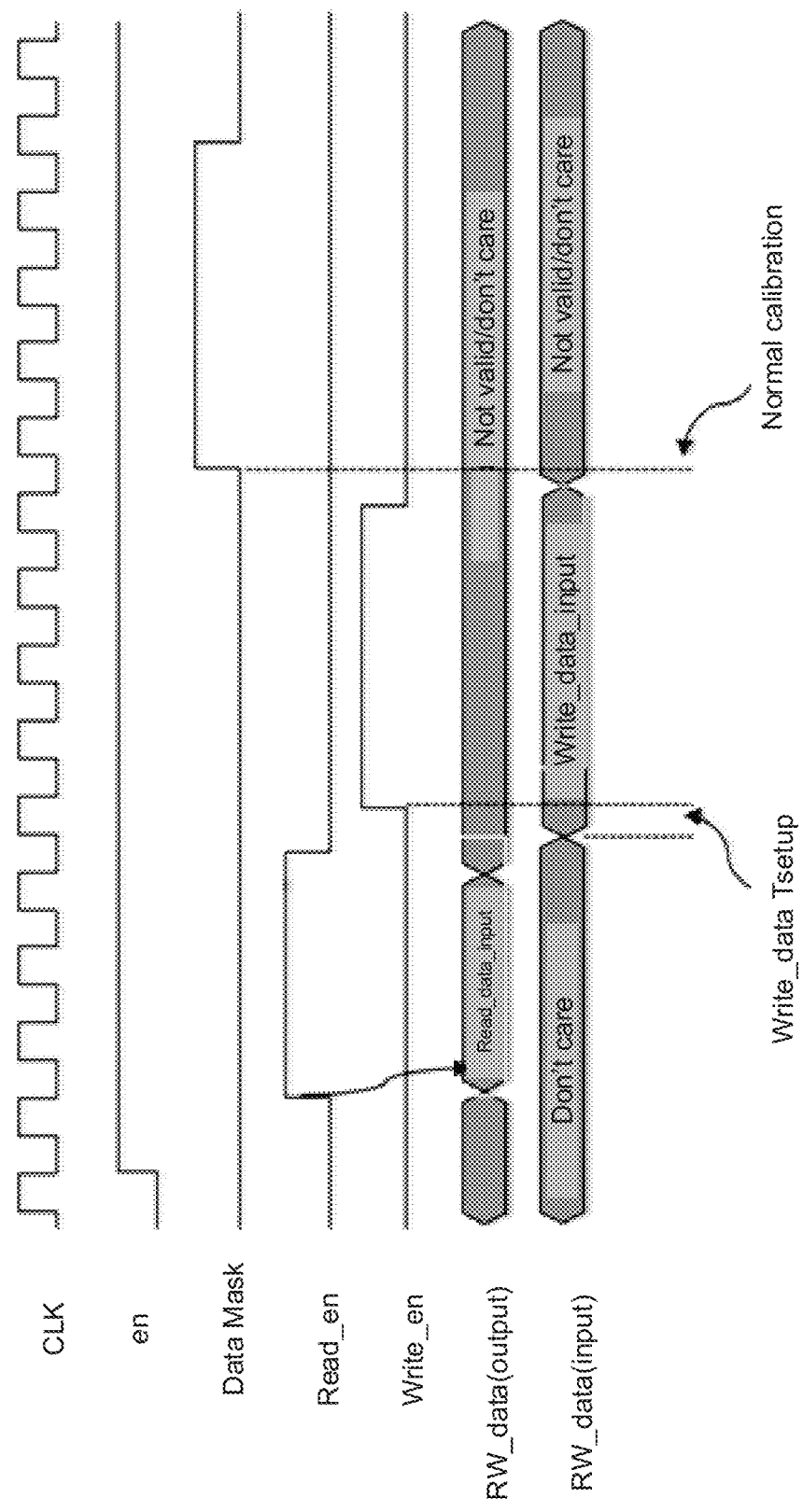
FIG. 5B illustrates an exemplary implementation of interface timing of feedback path data and data mask generation according to aspects of the present disclosure.

FIG. 5B illustrates an exemplary implementation of interface timing of feedback path data and data mask generation according to aspects of the present disclosure. As shown in FIG. 5B, both data_mask and data_in signals may be generated from a same clock edge. It is desirable that the data_mask signal to be arrived at the performance adjuster block before data_in signal. Note that though the data_mask or data_in signal may not need to be generated every clock cycle, as long as the performance adjuster may gather sufficient feedback path data for its calibration during a period of time. In some implementations, it is desirable that the data through the feedback path be toggled every clock cycle (clock like pattern) or use PRBS generated pattern. Depends on the time delay from feedback path to the performance adjuster, this time delay may be subtracted from the feedback path by stop reading the data_in before the signal transitions from one state to another state.

Figure 6A:
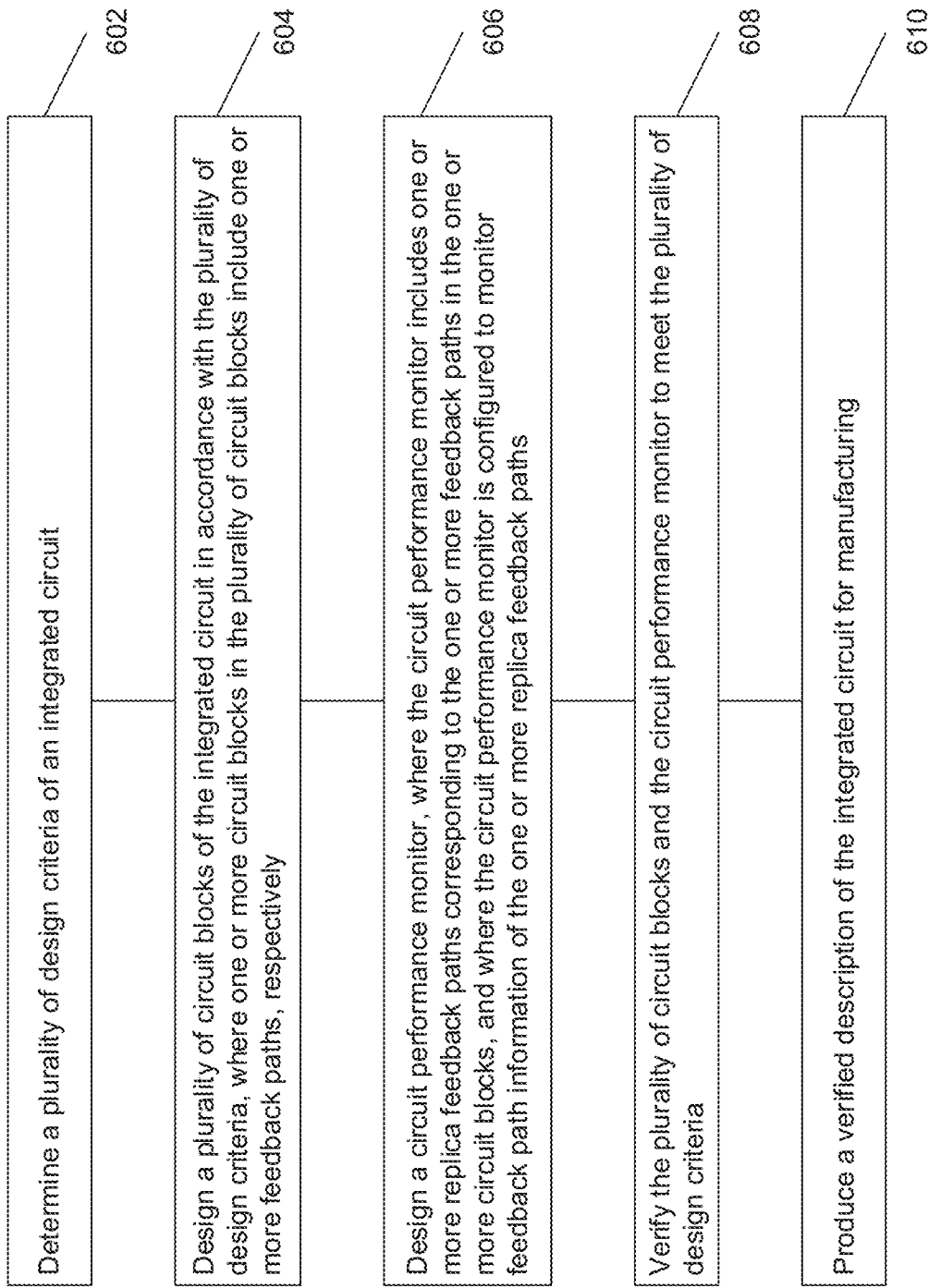
FIG. 6A illustrates an exemplary method of designing an integrated circuit according to aspects of the present disclosure.

FIG. 6A illustrates an exemplary method of designing an integrated circuit according to aspects of the present disclosure. In the example shown in FIG. 6A, in block 602, the method determines a plurality of design criteria of the integrated circuit. In block 604, the method designs a plurality of circuit blocks of the integrated circuit in accordance with the plurality of design criteria, where one or more circuit blocks in the plurality of circuit blocks include one or more feedback paths, respectively. In block 606, the method designs a circuit performance monitor, where the circuit performance monitor includes one or more replica feedback paths corresponding to the one or more feedback paths in the one or more circuit blocks, and where the circuit performance monitor is configured to monitor feedback path information of the one or more replica feedback paths. In block 608, the method verifies the plurality of circuit blocks and the circuit performance monitor to meet the plurality of design criteria. In block 610, the method produces a verified description of the integrated circuit for manufacturing.

FIG. 6B illustrates an exemplary method of designing a performance data collector according to aspects of the present disclosure. As shown in FIG. 6B, in block 612, the method collects measured performance data of the one or more replica feedback paths. In block 614, the method compares the measured performance data to a set of reference performance data. In block 616, the method generates performance differences between the measured performance data and the set of reference performance data based on the comparison.

FIG. 6C illustrates an exemplary method of designing a signal quality data collector according to aspects of the present disclosure. In the exemplary method of FIG. 6C, in block 622, the method collects measured signal quality data of the one or more replica feedback paths. In block 624, the method compares the measured signal quality data to a set of reference signal quality data. In block 626, the method generates signal quality differences between the measured signal quality data and the set of reference signal quality data based on the comparison.

FIG. 6D illustrates an exemplary method of designing a performance adjuster according to aspects of the present disclosure. In the example of FIG. 6D, in block 632, the method determines one or more adjustment voltage values based at least in part on the feedback path information of the one or more replica feedback paths, where the feedback path information includes at least one of performance data or signal quality data of the one or more replica feedback paths. In block 634, the method adjusts corresponding supply voltages of the one or more circuit blocks using the one or more adjustment voltage values during operation of the integrated circuit.

FIG. 6E illustrates an exemplary method of designing a circuit parameter controller according to aspects of the present disclosure. As shown in FIG. 6E, in block 642, the method determines one or more adjustment circuit parameter values based at least in part on the feedback path information of the one or more replica feedback paths, where the feedback path information includes at least one of performance data or signal quality data of the one or more replica feedback paths. In block 644, the method adjusts corresponding circuit parameters of the one or more circuit blocks using the one or more adjustment circuit parameter values during operation of the integrated circuit. According to aspects of the present disclosure, the circuit parameters of the one or more circuit blocks includes at least one of: threshold voltages of the one or more circuit blocks, power usage of the one or more circuit blocks, electrical impedance of the one or more circuit blocks, operating frequencies of the one or more circuit blocks, or a combination thereof.

FIG. 6F illustrates an exemplary method of designing an operating environment controller according to aspects of the present disclosure. In the example of FIG. 6F, in block 652, the method determines one or more adjustment operating environment values based at least in part on the feedback path information of the one or more replica feedback paths, where the feedback path information includes at least one of performance data or signal quality data of the one or more replica feedback paths. In block 654, the method adjusts corresponding operating environment of the one or more circuit blocks using the one or more adjustment operating environment values during operation of the integrated circuit. According to aspects of the present disclosure, the operating environment of the one or more circuit blocks includes at least one of corresponding temperatures or thermal impedance of the one or more circuit blocks.

Figure 7A:
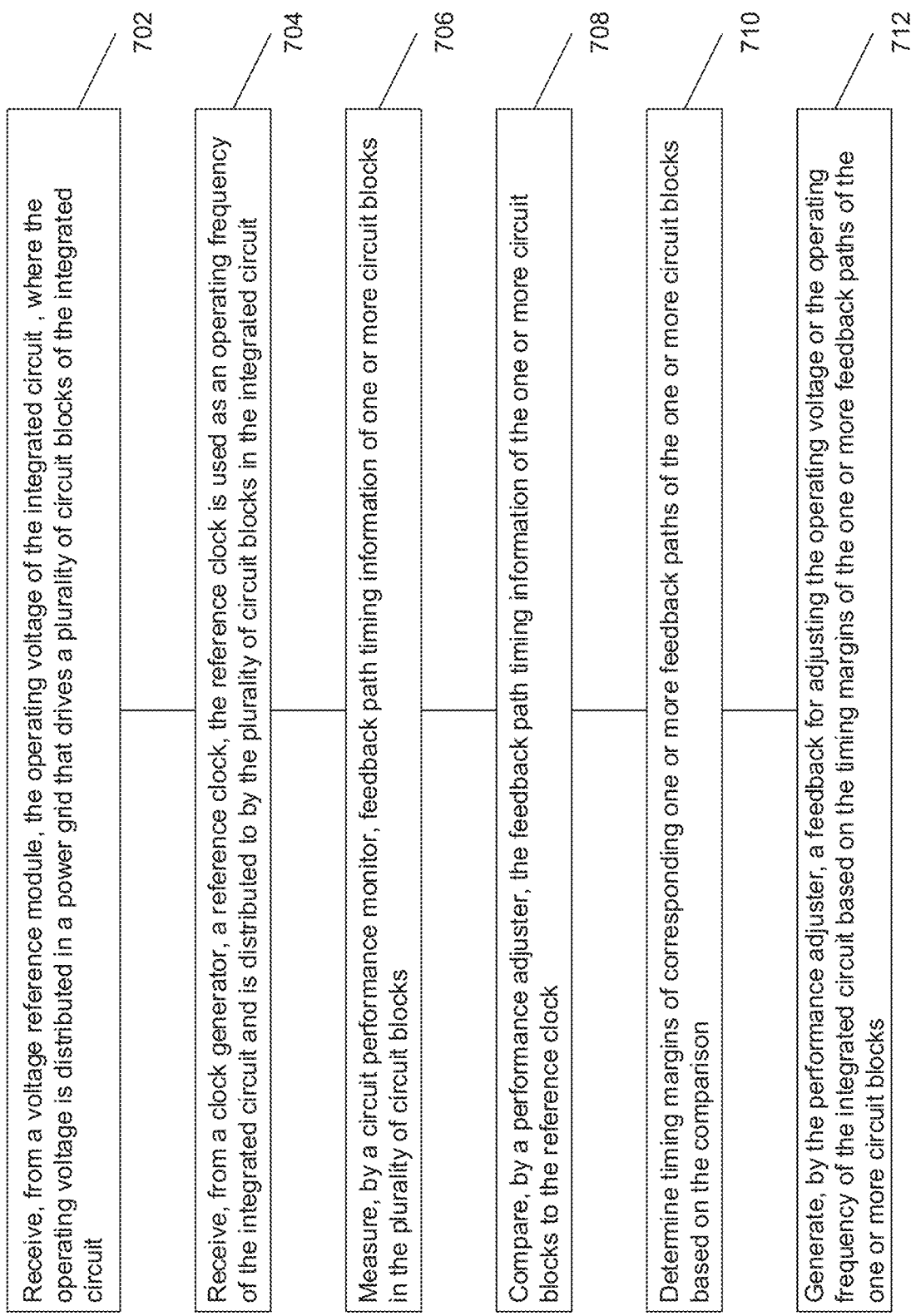
FIG. 7A illustrates an exemplary method of dynamically adjusting an operating voltage of an integrated circuit according to aspects of the present disclosure.

FIG. 7A illustrates an exemplary method of dynamically adjusting an operating voltage of an integrated circuit according to aspects of the present disclosure. As shown in the example of FIG. 7A, in block 702, the method receives, from a voltage reference module, the operating voltage of the integrated circuit, where the operating voltage is distributed in a power grid that drives a plurality of circuit blocks of the integrated circuit. In block 704, the method receives, from a clock generator, a reference clock, where the reference clock is used as an operating frequency of the integrated circuit and is distributed to by the plurality of circuit blocks in the integrated circuit. In block 706, the method measures, by a circuit performance monitor, feedback path timing information of one or more circuit blocks in the plurality of circuit blocks. In block 708, the method compares, by a performance adjuster, the feedback path timing information of the one or more circuit blocks to the reference clock. In block 710, the method determines, by the performance adjuster timing margins of corresponding one or more feedback paths of the one or more circuit blocks based on the comparison. In block 712, the method generates, by the performance adjuster, a feedback for adjusting the operating voltage or the operating frequency of the integrated circuit based on the timing margins of the one or more feedback paths of the one or more circuit blocks.

According to aspects of the present disclosure, the operating voltage includes a first voltage indicative of a supply voltage and a second voltage indicative of a circuit ground.

The circuit performance monitor may include one or more replica feedback paths corresponding to one or more feedback paths in the one or more circuit blocks, and where the feedback path timing information includes feedback path delay data of the one or more replica feedback paths.

Figures 7B, 7C:
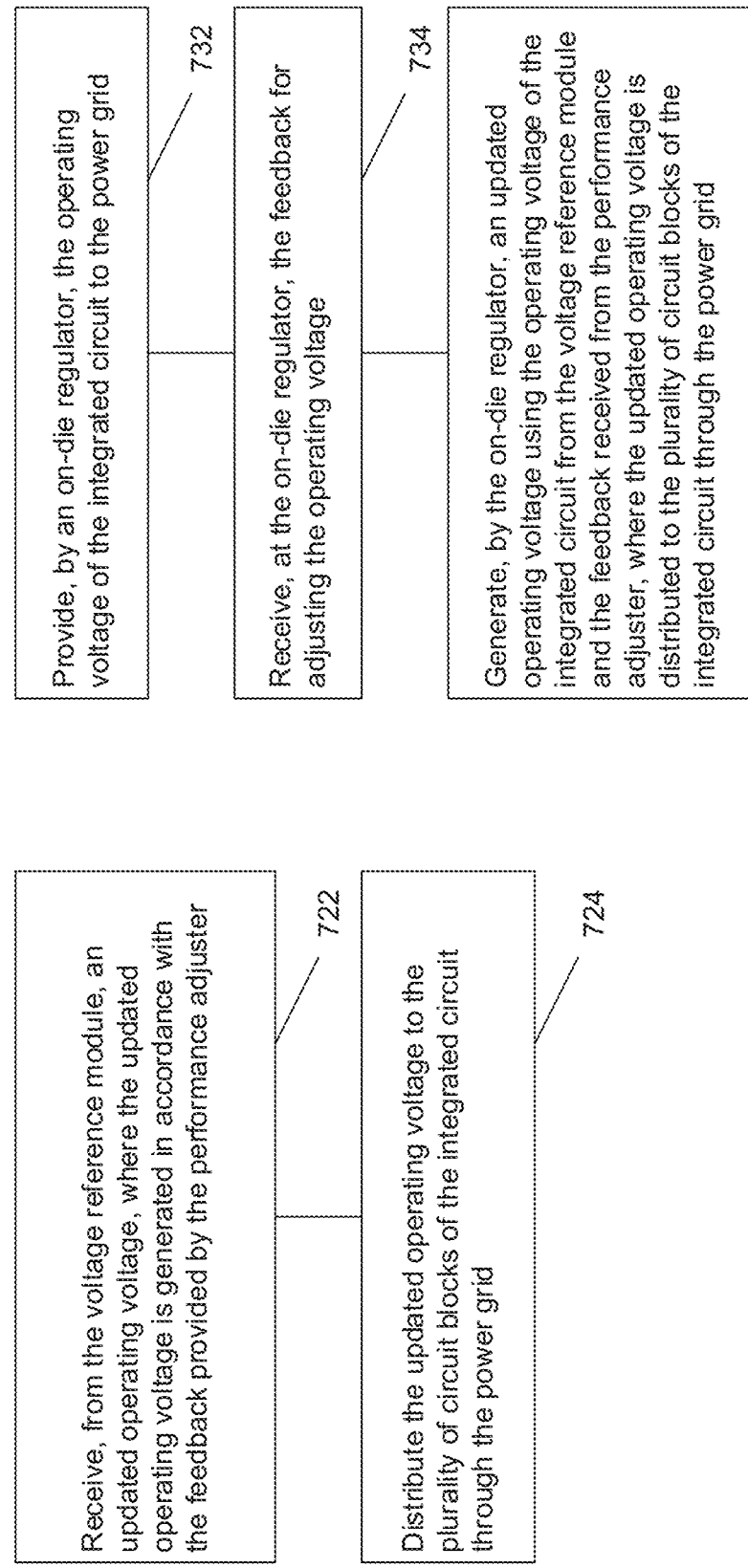
FIG. 7B illustrates an exemplary implementation of dynamically adjusting the operating voltage of the integrated circuit of FIG. 7A according to aspects of the present disclosure.
FIG. 7C illustrates another exemplary implementation of dynamically adjusting the operating voltage of the integrated circuit of FIG. 7A according to aspects of the present disclosure.

FIG. 7B illustrates an exemplary implementation of dynamically adjusting the operating voltage of the integrated circuit of FIG. 7A according to aspects of the present disclosure. In the exemplary implementation of FIG. 7B, in block 722, the method receives, from the voltage reference module, an updated operating voltage, where the updated operating voltage is generated in accordance with the feedback provided by the performance adjuster. In block 724, the method distributes the updated operating voltage to the plurality of circuit blocks of the integrated circuit through the power grid.

FIG. 7C illustrates another exemplary implementation of dynamically adjusting the operating voltage of the integrated circuit of FIG. 7A according to aspects of the present disclosure. As shown in FIG. 7C, in block 732, the method provides, by an on-die regulator, the operating voltage of the integrated circuit to the power grid. In block 734, the method receives, at the on-die regulator, the feedback for adjusting the operating voltage. In block 736, the method generates, by the on-die regulator, an updated operating voltage using the operating voltage of the integrated circuit from the voltage reference module and the feedback received from the performance adjuster, where the updated operating voltage is distributed to the plurality of circuit blocks of the integrated circuit through the power grid.

Figure 7D:
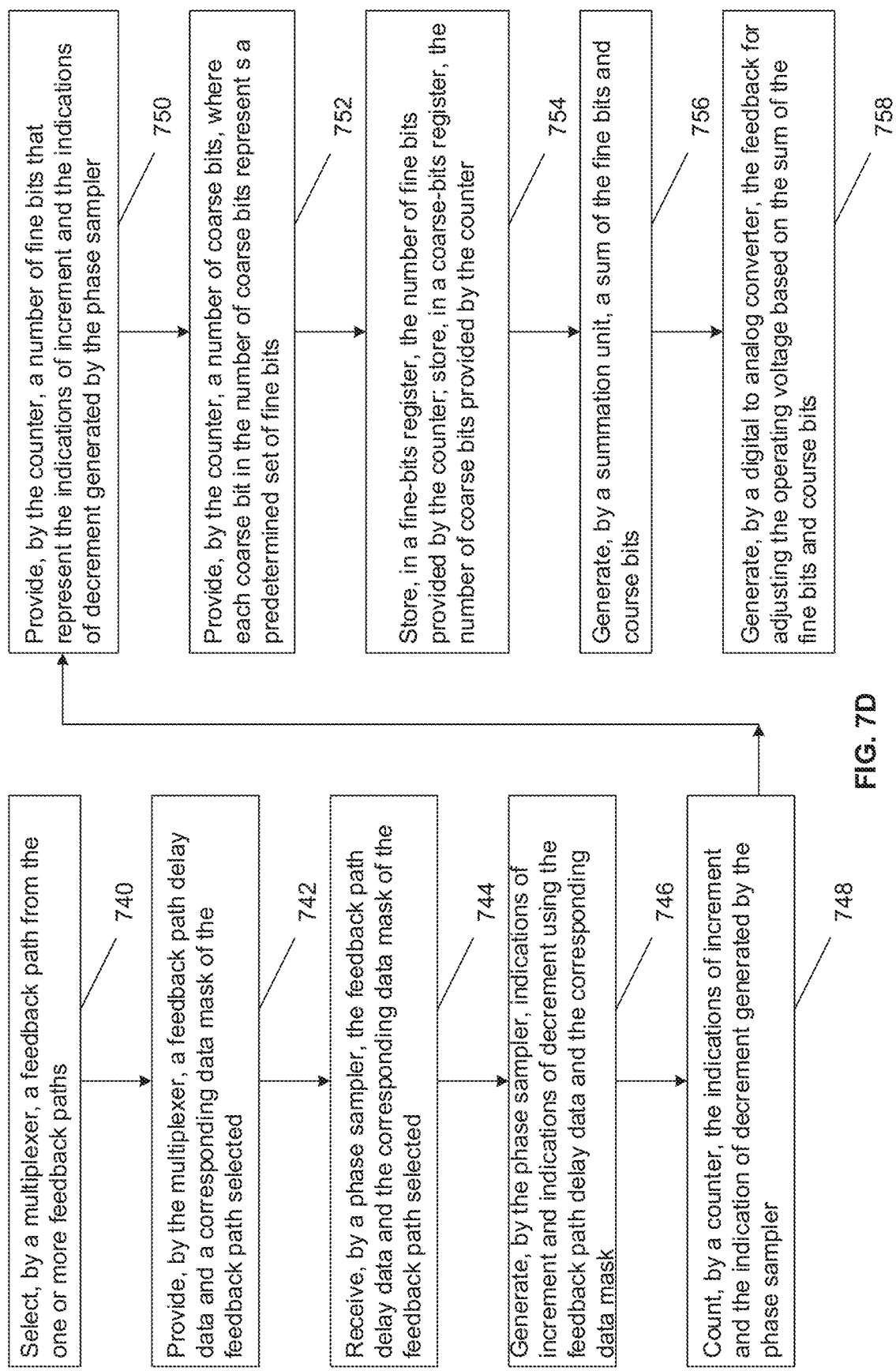
FIG. 7D illustrates an exemplary implementation of controlling the performance adjuster for dynamically adjusting the operating voltage of the integrated circuit of FIG. 7A according to aspects of the present disclosure.

FIG. 7D illustrates an exemplary implementation of controlling the performance adjuster for dynamically adjusting the operating voltage of the integrated circuit of FIG. 7A according to aspects of the present disclosure. In the example of FIG. 7D, in block 740, the method selects, by a multiplexer, a feedback path from the one or more feedback paths. In block 742, the method provides, by the multiplexer, a feedback path delay data and a corresponding data mask of the feedback path selected. In block 744, the method receives, by a phase sampler, the feedback path delay data and the corresponding data mask of the feedback path selected. In block 746, the method generates, by the phase sampler, indications of increment and indications of decrement using the feedback path delay data and the corresponding data mask. According to aspects of the present disclosure, the phase sampler is operated according to a feedback path data sampling window identified based on at least one of: a period when a corresponding feedback path data mask is asserted, or a trigger configured to indicate a period of measured performance data being sampled, where the trigger is generated based on a state of the feedback path or the trigger is generated to create a toggle of a launching flip flop of the feedback path based on a state of the launching flip flop. In block 748, the method counts, by a counter, the indications of increment and the indication of decrement generated by the phase sampler. In block 750, the method provides a number of fine bits that represent the indications of increment and the indications of decrement generated by the phase sampler. In block 752, the method provides a number of coarse bits, where each coarse bit in the number of coarse bits represent s a predetermined set of fine bits. In block 754, the method stores, in a fine-bits register, the number of fine bits provided by the counter; and stores, in a coarse-bits register, the number of coarse bits provided by the counter. In block 756, the method generates, by a summation unit, a sum of the fine bits and course bits. In block 758, the method generates, by a digital to analog converter, the feedback for adjusting the operating voltage based on the sum of the fine bits and course bits.

With the capabilities of adjustment of power, circuit parameters, operating environments, and circuit behaviors, the present disclosure provides various advantages over the conventional approach of designing, manufacturing, and operating an integrated circuit. For example, one advantage is that the disclosed integrated circuit may be adjusted to achieve a lower power consumption for a desired performance, or conversely achieve a higher performance for a given power consumption or a higher performance per unit power. Another advantage is that the adjustment of power, circuit parameters, operating environments, and circuit behaviors can be accomplished after an integrated circuit has been manufactured; and the adjustment can be accomplished without affecting the timing of the feedback paths and without perturbation to the operations of the integrated circuits. Yet another advantage is that since the integrated circuit may be adjusted after manufacturing, the design process may be simplified and the design duration may be shortened by reducing or minimizing the extensive iterative static timing analysis and timing verification during the design phase of the integrated circuit.

One skilled in the relevant art will recognize that many possible modifications and combinations of the disclosed embodiments may be used, while still employing the same basic underlying mechanisms and methodologies. The foregoing description, for purposes of explanation, has been written with references to specific embodiments. However, the illustrative discussions above are not intended to be exhaustive or to limit the invention to the precise forms disclosed. Many modifications and variations are possible in view of the above teachings. The embodiments were chosen and described to explain the principles of the invention and their practical applications, and to enable others skilled in the art to best utilize the invention and various embodiments with various modifications as suited to the particular use contemplated.

What is claimed is:

1. A method of dynamically adjusting an operating conditions of an integrated circuit, comprising:

receiving, from a voltage reference module, an operating voltage of the integrated circuit, wherein the operating voltage is distributed in a power grid that drives a plurality of circuit blocks of the integrated circuit;

receiving, from a clock generator, a reference clock, wherein the reference clock is used as an operating frequency of the integrated circuit and is distributed to by the plurality of circuit blocks in the integrated circuit;

measuring, by a circuit performance monitor, feedback path timing information of one or more circuit blocks in the plurality of circuit blocks, wherein the circuit performance monitor includes one or more replica feedback paths corresponding to one or more feedback paths in the one or more circuit blocks, and wherein the feedback path timing information includes feedback path delay data of the one or more replica feedback paths;

comparing, by a performance adjuster, the feedback path timing information of the one or more circuit blocks to the reference clock;

determining timing margins of corresponding one or more feedback paths of the one or more circuit blocks based on the comparison; and generating, by the performance adjuster, a feedback for adjusting the operating voltage or the operating frequency of the integrated circuit based on the timing margins of the one or more feedback paths of the one or more circuit blocks.

2. The method of claim 1, further comprising:
receiving, from the voltage reference module, an updated operating voltage, wherein the updated operating voltage is generated in accordance with the feedback provided by the performance adjuster; and
distributing the updated operating voltage to the plurality of circuit blocks of the integrated circuit through the power grid.

3. The method of claim 1, further comprising:
providing, by an on-die regulator, the operating voltage of the integrated circuit to the power grid;
receiving, at the on-die regulator, the feedback for adjusting the operating voltage; and
generating, by the on-die regulator, an updated operating voltage using the operating voltage of the integrated circuit from the voltage reference module and the feedback received from the performance adjuster, wherein the updated operating voltage is distributed to the plurality of circuit blocks of the integrated circuit through the power grid.

4. The method of claim 1, wherein
the one or more feedback paths are identified based on static timing analysis of the integrated circuit; and
for each feedback path in the one or more feedback paths, a replica feedback path is created near the feedback path with same circuit components and with same path length between the same circuit components.

5. The method of claim 1, wherein comparing the feedback path timing information of the one or more circuit blocks to the reference clock comprises:
selecting, by a multiplexer, a feedback path from the one or more feedback paths; and
providing, by the multiplexer, a feedback path delay data, a corresponding data mask and a clock of the feedback path selected.

6. The method of claim 5, further comprising:
receiving, by a phase sampler, the feedback path delay data and the corresponding data mask of the feedback path selected; and
generating, by the phase sampler, indications of increment and indications of decrement using the feedback path delay data, the corresponding data mask and the clock of the feedback path selected.

7. The method of claim 6, wherein the phase sampler is operated according to a feedback path data sampling window identified based on at least one of:
a period when a corresponding feedback path data mask is asserted; or
a trigger configured to indicate a period of measured performance data being sampled, wherein the trigger is generated based on a state of the feedback path or the trigger is generated to create a toggle of a launching flip flop of the feedback path based on a state of the launching flip flop.

8. The method of claim 6, further comprising:
counting, by a counter, the indications of increment and the indication of decrement generated by the phase sampler;
providing, by the counter, a number of fine bits that represent the indications of increment and the indications of decrement generated by the phase sampler; and
providing, by the counter, a number of coarse bits, wherein each coarse bit in the number of coarse bits represent s a predetermined set of fine bits.

9. The method of claim 8, further comprising:
storing, in a fine-bits register, the number of fine bits provided by the counter;
storing, in a coarse-bits register, the number of coarse bits provided by the counter;
generating, by a summation unit, a sum of the fine bits and course bits; and
generating, by a digital to analog converter, the feedback for adjusting the operating voltage based on the sum of the fine bits and course bits.

10. An integrated circuit with dynamically adjustable operating conditions, comprising:
a power grid configured to receive an operating voltage of the integrated circuit from a voltage reference module, wherein the operating voltage is distributed to drive a plurality of circuit blocks of the integrated circuit;
a clock generator configured to receive a reference clock, wherein the reference clock is used as an operating frequency of the integrated circuit and is distributed to by the plurality of circuit blocks in the integrated circuit;
a circuit performance monitor configured to measure feedback path timing information of one or more circuit blocks in the plurality of circuit blocks, wherein the circuit performance monitor includes one or more replica feedback paths corresponding to one or more feedback paths in the one or more circuit blocks, and wherein the feedback path timing information includes feedback path delay data of the one or more replica feedback paths; and
a performance adjuster configured to compare the feedback path timing information of the one or more circuit blocks to the reference clock, determine timing margins of corresponding one or more feedback paths of the one or more circuit blocks based on the comparison, and generate a feedback for adjusting the operating voltage or the operating frequency of the integrated circuit based on the timing margins of the one or more feedback paths of the one or more circuit blocks.

11. The integrated circuit of claim 10, wherein the power grid is further configured to:
receive, from the voltage reference module, an updated operating voltage, wherein the updated operating voltage is generated in accordance with the feedback provided by the performance adjuster; and
distribute the updated operating voltage to the plurality of circuit blocks of the integrated circuit through the power grid.

12. The integrated circuit of claim 10, further comprises an on-die regulator configured to:
provide the operating voltage of the integrated circuit to the power grid;
receive the feedback for adjusting the operating voltage; and
generate an updated operating voltage using the operating voltage of the integrated circuit from the voltage reference module and the feedback received from the performance adjuster, wherein the updated operating voltage is distributed to the plurality of circuit blocks of the integrated circuit through the power grid.

13. The integrated circuit of claim 10, wherein
the one or more feedback paths are identified based on static timing analysis of the integrated circuit; and
for each feedback path in the one or more feedback paths, a replica feedback path is created near the feedback path with same circuit components and with same path length between the same circuit components.

14. The integrated circuit of claim 10, wherein the performance adjuster comprises a multiplexer configured to:
- select a feedback path from the one or more feedback paths; and
- provide a feedback path delay data, a corresponding data mask and a clock of the feedback path selected.

15. The integrated circuit of claim 14, wherein the performance adjuster further comprises a phase sampler configured to:
- receive the feedback path delay data, the corresponding data mask and the clock of the feedback path selected; and
- generate indications of increment and indications of decrement using the feedback path delay data, the corresponding data mask and the clock of the feedback path selected.

16. The integrated circuit of claim 15, wherein the phase sampler is operated according to a feedback path data sampling window identified based on at least one of:
- a period when a corresponding feedback path data mask is asserted; or
- a trigger configured to indicate a period of measured performance data being sampled, wherein the trigger is generated based on a state of the feedback path or the trigger is generated to create a toggle of a launching flip flop of the feedback path based on a state of the launching flip flop.

17. The integrated circuit of claim 15, wherein the performance adjuster further comprises a counter configured to:
- count the indications of increment and the indication of decrement generated by the phase sampler;
- provide a number of fine bits that represent the indications of increment and the indications of decrement generated by the phase sampler; and
- provide a number of coarse bits, wherein each coarse bit in the number of coarse bits represent s a predetermined set of fine bits.

18. The integrated circuit of claim 17, wherein the performance adjuster further comprises:
- a fine-bits register configured to store the number of fine bits provided by the counter;
- a coarse-bits register configured to store the number of coarse bits provided by the counter;
- a summation unit configured to generate a sum of the fine bits and course bits; and a digital to analog converter configured to generate the feedback for adjusting the operating voltage based on the sum of the fine bits and course bits.

* * * * *